United States Patent
Colinge

(10) Patent No.: US 9,275,910 B2
(45) Date of Patent: *Mar. 1, 2016

(54) SEMICONDUCTOR-ON-INSULATOR STRUCTURE AND METHOD OF FABRICATING THE SAME

(71) Applicant: Taiwan Semiconductor Manufacturing Company Limited, Hsinchu (TW)

(72) Inventor: Jean-Pierre Colinge, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/712,995

(22) Filed: May 15, 2015

(65) Prior Publication Data

US 2015/0262888 A1    Sep. 17, 2015

Related U.S. Application Data

(63) Continuation of application No. 14/278,321, filed on May 15, 2014, now Pat. No. 9,034,717, which is a continuation-in-part of application No. 14/055,229, filed on Oct. 16, 2013, now Pat. No. 9,111,996.

(51) Int. Cl.
*H01L 21/331*    (2006.01)
*H01L 21/76*    (2006.01)
(Continued)

(52) U.S. Cl.
CPC .................. *H01L 21/84* (2013.01); *B82Y 10/00* (2013.01); *B82Y 40/00* (2013.01);
(Continued)

(58) Field of Classification Search
CPC ...................... H01L 21/26506; H01L 27/1203; H01L 21/84; H01L 29/7847; H01L 21/2022; H01L 21/2652
USPC .......... 257/190, 349, 487, 496, 546; 438/310, 438/341, 357, 402, 413, 471, 478, 481, 482
See application file for complete search history.

(56) References Cited

U.S. PATENT DOCUMENTS 9,034,717 B2 * 5/2015 Colinge ........................ 438/310
2007/0232033 A1 * 10/2007 Wieczorek et al. ........... 438/482

OTHER PUBLICATIONS

Colinge, Cynthia, Roberds, Brian, Doyle, Brian; Silicon Layer Transfer Using Wafer Bonding and Debonding; Journal of Electronic Materials, 30(7); pp. 841-844; 2001.

(Continued)

*Primary Examiner* — Hsien Ming Lee
(74) *Attorney, Agent, or Firm* — Jones Day

(57) ABSTRACT

Methods for forming a layer of semiconductor material and a semiconductor-on-insulator structure are provided. A substrate including one or more devices or features formed therein is provided. A seed layer is bonded to the substrate, where the seed layer includes a crystalline semiconductor structure. A first portion of the seed layer that is adjacent to an interface between the seed layer and the substrate is amorphized. A second portion of the seed layer that is not adjacent to the interface is not amorphized and maintains the crystalline semiconductor structure. Dopant implantation is performed to form an N-type conductivity region or a P-type conductivity region in the first portion of the seed layer. A solid-phase epitaxial growth process is performed to crystallize the first portion of the seed layer. The SPE growth process uses the crystalline semiconductor structure of the second portion of the seed layer as a crystal template.

20 Claims, 9 Drawing Sheets

(51) Int. Cl.
| | |
|---|---|
| H01L 21/20 | (2006.01) |
| H01L 23/58 | (2006.01) |
| H01L 21/84 | (2006.01) |
| H01L 29/06 | (2006.01) |
| H01L 23/544 | (2006.01) |
| H01L 21/762 | (2006.01) |
| H01L 29/78 | (2006.01) |
| B82Y 10/00 | (2011.01) |
| B82Y 40/00 | (2011.01) |
| H01L 29/66 | (2006.01) |
| H01L 29/775 | (2006.01) |
| H01L 21/02 | (2006.01) |
| H01L 21/265 | (2006.01) |

(52) U.S. Cl.
CPC ... *H01L 21/02617* (2013.01); *H01L 21/02667* (2013.01); *H01L 21/26513* (2013.01); *H01L 21/7624* (2013.01); *H01L 21/76251* (2013.01); *H01L 23/544* (2013.01); *H01L 29/0649* (2013.01); *H01L 29/0673* (2013.01); *H01L 29/66439* (2013.01); *H01L 29/66477* (2013.01); *H01L 29/775* (2013.01); *H01L 29/78* (2013.01); *H01L 2223/54426* (2013.01); *H01L 2223/54453* (2013.01); *H01L 2224/32145* (2013.01); *H01L 2924/0002* (2013.01)

(56) References Cited

OTHER PUBLICATIONS

Colinge, Jean-Pierre; Silicon-on-Insulator Technology: Materials to VLSI, 3rd Edition; Kluwer Academic Publishers, Boston: MA; 2004.
Duffy, R., Shayesteh, M., McCarthy, B., Blake, A., White, M., Scully, J., Yu, R., Kelleher, A.-M., Schmidt, M., Petkov, N., Pelaz, L., Marques, L.A.; The Curious Case of Thin-Body Ge Crystallization; Applied Physics Letters, 99; pp. 131910-1-131910-3; 2011.
Moriceau, H., Rayssac, O., Aspar, B., Ghyselen, B.; The Bonding Energy Control: An Original Way to Obtain "Debondable Substrates"; Electrochemical Society Proceedings, 2003(19); pp. 49-56; 2003.

* cited by examiner

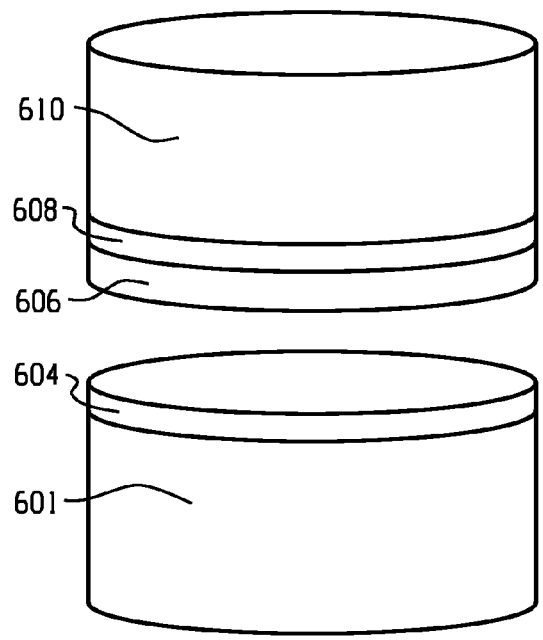
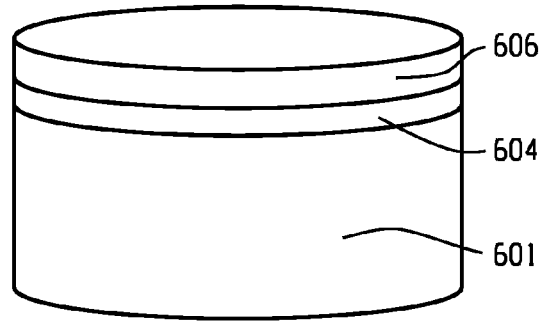
Fig. 6A
Fig. 6B
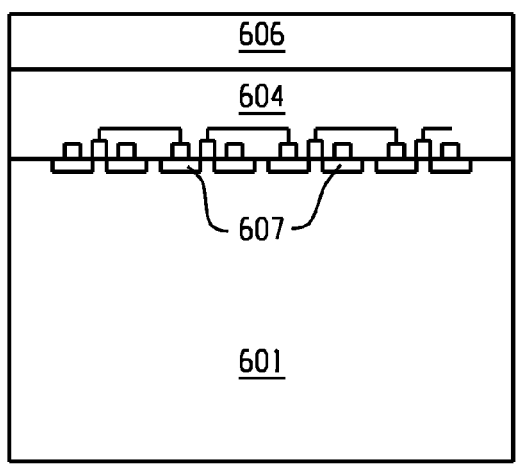
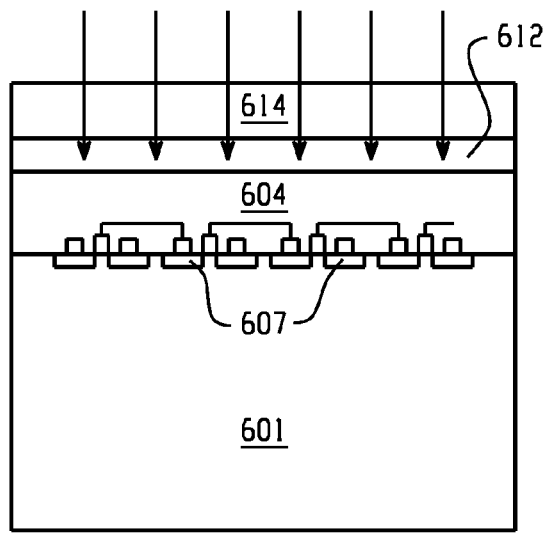
Fig. 6C
Fig. 6D

US 9,275,910 B2

SEMICONDUCTOR-ON-INSULATOR STRUCTURE AND METHOD OF FABRICATING THE SAME

CROSS-REFERENCE TO RELATED APPLICATIONS

This application is a continuation of U.S. patent application Ser. No. 14/278,321 filed on May 15, 2014, which is a continuation-in-part of U.S. patent application Ser. No. 14/055,229 filed on Oct. 16, 2013. Each of the above cross-referenced patent applications is hereby incorporated by reference in its entirety.

BACKGROUND

In bulk semiconductor substrates, an active semiconductor region of a transistor may be disposed in a well region, where the well region is located within a bulk semiconductor region. In such structures, junction capacitance between the well region and the bulk semiconductor region may impact device performance. By contrast, some microelectronic devices place active semiconductor regions in an upper semiconductor layer of a semiconductor-on-insulator ("SOI") substrate. The upper semiconductor layer may be separated from a bulk semiconductor region of the substrate by an insulating layer such as a buried oxide ("BOX") layer. The insulating layer may improve device performance by eliminating junction capacitance between the upper semiconductor layer and the bulk semiconductor region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A depicts a bonding of a seed layer to a substrate, in accordance with some embodiments.

FIG. 6B depicts a removal of a portion of a semiconductor-on-insulator (SOI) structure from the substrate, in accordance with some embodiments.

FIG. 6C depicts a cross-sectional view of the structure following the removal of the portion of the SOI structure from the substrate, the structure including devices formed in the substrate, in accordance with some embodiments.

FIG. 6D depicts an example amorphizing of a first portion of the seed layer, in accordance with some embodiments.

DETAILED DESCRIPTION

Figure 1:
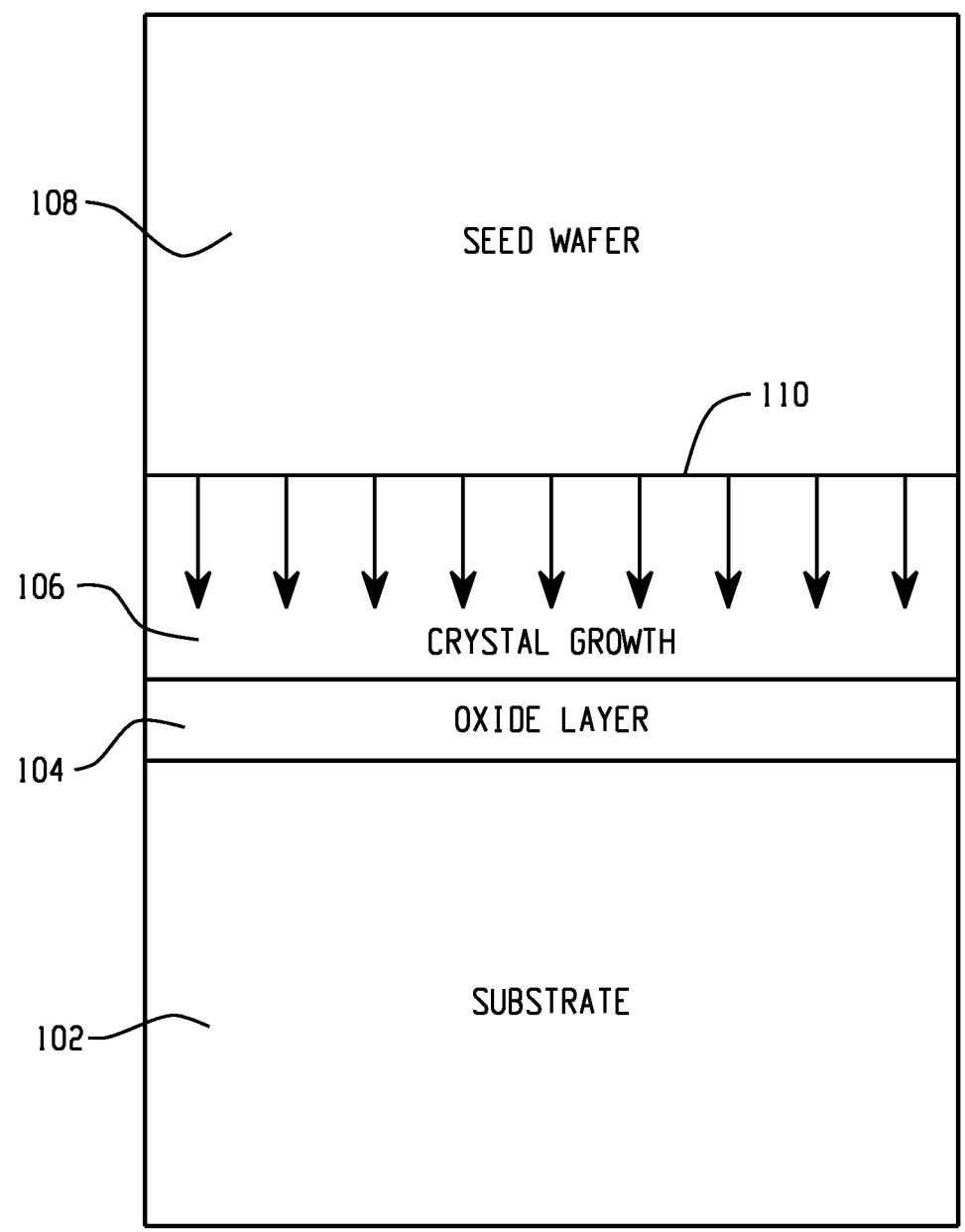
FIG. 1 depicts an example solid-phase epitaxial (SPE) growth process used to crystallize an amorphous semiconductor layer to form a semiconductor-on-insulator (SOI) structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 depicts an example solid-phase epitaxial growth process used to crystallize an amorphous semiconductor layer 106 to form a semiconductor-on-insulator (SOI) structure, in accordance with some embodiments. In the example of FIG. 1, a combination of a bonding process and a solid-phase epitaxial growth process may be used to form a single-crystal semiconductor layer substantially over an insulator layer 104. Specifically, an oxide layer 104 may be formed substantially over a substrate 102. The oxide layer 104 may be, for example, a silicon oxide layer, a silicon dioxide layer, or a layer comprising another insulating material. The substrate 102 may be, for example, a bulk silicon substrate or another semiconductor substrate. The amorphous layer 106 may be formed substantially over the oxide layer 104, where the amorphous layer 106 includes a semiconductor material or a semiconductor alloy material (e.g., amorphous germanium, amorphous silicon, etc.).

A seed wafer 108 may be bonded to the amorphous layer 106. The seed wafer 108 may include a crystalline semiconductor structure. The seed wafer 108 may be, for example, a crystalline silicon substrate having a (100), (110), (111), or other crystal orientation, a sapphire wafer, a crystalline SiGe wafer, or a wafer of another crystalline material with suitable lattice parameters.

The solid-phase epitaxial growth process (which may also be referred to herein as a "regrowth" process) may be performed to crystallize the amorphous layer 106 (e.g., convert the amorphous layer 106 into a layer including a crystalline structure), where the growth process may use the crystalline semiconductor structure of the seed wafer 108 as a crystal template. Thus, the solid-phase epitaxial growth process may begin at an interface 110 between the seed wafer 108 and the amorphous layer 106, and may proceed downward through an entirety of a thickness of the amorphous layer 106. The solid-phase epitaxial growth process may cause an entirety of the amorphous layer 106 to become a single-crystal semiconductor layer.

After performing the solid-phase epitaxial growth process, the seed wafer 108 may be debonded from the structure, such that the layers 102, 104, 106 may then comprise a semiconductor-on-insulator (SOI) structure. After depositing a second insulating layer substantially over the SOI structure (not depicted in the example of FIG. 1), the steps described above may be repeated one or more times to form a succession of insulator layers and single-crystal semiconductor layers. The repeated steps may include forming a second amorphous layer substantially over the second insulating layer, bonding a seed wafer to the second amorphous layer, recrystallizing the second amorphous layer using a solid-phase epitaxial growth process, and debonding the seed wafer.

As illustrated in FIG. 1, the solid-phase epitaxial growth process may be a "top-down" growth process, where the crystal template for the growth process may be located in the foreign seed wafer 108 that is bonded to a top surface of the amorphous layer 106. The top-down growth process may be in contrast to conventional, "bottom-up" techniques that utilize a crystal template for a regrowth process that is located below an amorphous layer to be recrystallized. In the conventional, bottom-up techniques, the crystal template for regrowth may not come from a foreign wafer, but may rather come from a layer over which the amorphous layer was deposited or formed. In the top-down regrowth process of FIG. 1, because the seed crystal comes from a foreign wafer that is not located at a bottom of the structure, the seed crystal may be debonded, such that the stacking and regrowth process can be repeated multiple times. For each repeated regrowth process, "fresh" crystal information may be used (e.g., crystal information from the foreign seed wafer that is not a layer of the structure), such that there may not be degradation of the crystal quality as the number of recrystallized layers increases.

The example process of FIG. 1 may allow layers of different semiconductor materials with different crystal orientations and different levels of stress and strain to be fabricated in a stack structure, where the semiconductor layers are separated by insulating materials as described above. The process described herein may utilize only coarse alignment of the wafers to be bonded, where the coarse alignment may be less exacting as compared to a precision alignment utilized for conventional fabrication techniques (e.g., precision alignment that may include challenging through-wafer alignment using infrared light, where germanium and other semiconductor materials may not be transparent to the infrared light).

Figure 2A:
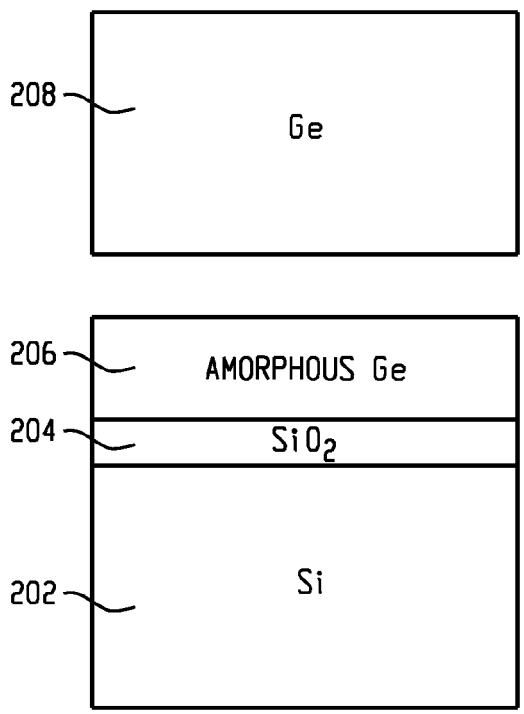
FIG. 2A depicts a beginning structure used in an example method of forming a layer of semiconductor material, in accordance with some embodiments.

FIG. 2A depicts a beginning structure used in an example method of forming a layer of semiconductor material, in accordance with some embodiments. In the beginning structure, an oxide layer 204 may be formed (e.g., via a growth process, a deposition process, an oxidation process, etc.) substantially over a substrate 202. The oxide layer 204 may be silicon oxide, silicon dioxide (i.e., as depicted in the example of FIG. 2A), or another insulating material. The substrate may be a bulk silicon wafer (i.e., as depicted in the example of FIG. 2A) or another type of substrate (e.g., a semiconductor substrate or an insulating substrate like glass).

An amorphous layer 206 may be formed substantially over the oxide layer 204 via a deposition or growth process. The amorphous layer 206 may include a semiconductor material or a semiconductor alloy material, and may be, specifically, an amorphous germanium layer (i.e., as depicted in the example of FIG. 2A), an amorphous silicon layer, or another amorphous semiconductor or semiconductor alloy layer. After forming the amorphous layer 206 substantially over the oxide layer 204, a chemical mechanical planarization (CMP) process may be used to planarize and smooth the amorphous layer 206, and the amorphous layer 206 may also be cleaned to remove a native oxide layer on the amorphous layer 206. Although the example of FIG. 2A depicts the amorphous layer 206 being formed substantially over the oxide layer 204 (e.g., such that a semiconductor-on-insulator structure may be formed, as depicted in FIG. 2F), in other examples, the amorphous layer 206 may be formed substantially over the substrate 202.

FIG. 2A also depicts a seed wafer 208. In the example of FIG. 2A, the seed wafer 208 may be separate from the amorphous layer 206 (e.g., the seed wafer 208 is depicted as being separate from the amorphous layer 206 prior to a bonding process that is described below with reference to FIG. 2B). The seed wafer 208 may include a crystalline semiconductor structure, and may include, for example, a crystalline germanium wafer (i.e., as depicted in the example of FIG. 2A), a crystalline silicon layer having a (100), (110), (111), or another crystal orientation, a sapphire wafer, or a crystalline SiGe wafer or a wafer of another crystalline material with suitable crystal lattice parameters. A CMP process may be used to planarize and smoothen the seed wafer 208, and the seed wafer 208 may also be cleaned to remove a native oxide layer on the seed wafer 208. The CMP and cleaning processes that may be applied to the amorphous layer 206 and the seed wafer 208 may be performed to improve a quality of a bond between the amorphous layer 206 and the seed wafer 208

(e.g., to achieve an atomic contact between the layers), as described below with reference to FIG. 2B.

Figure 2B:
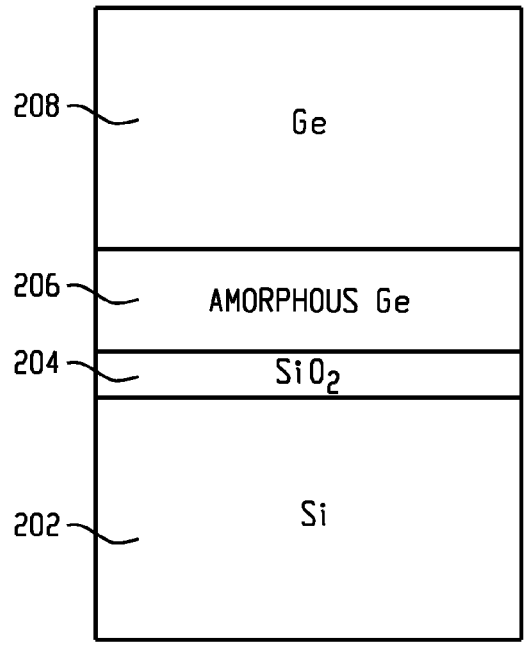
FIG. 2B depicts a bonding of a seed wafer to an amorphous semiconductor layer, in accordance with some embodiments.

FIG. 2B depicts a bonding of the seed wafer 208 to the amorphous semiconductor layer 206, in accordance with some embodiments. In bonding the seed wafer 208 to the amorphous layer 206, the bond strength may be such that atomically-intimate contact is formed between the layers 206, 208, while still allowing the seed wafer 208 to be debonded following a solid-phase epitaxial regrowth process (as described below with reference to FIG. 2E). The bonding process illustrated in FIG. 2B may utilize, for example, a hydrogen plasma, hydrofluoric acid (HF), hydrochloric acid (HCl), or hydrobromic acid (HBr) for passivation or activation of the bonding surfaces.

In the example of FIG. 2B, the seed wafer 208 may become connected to the amorphous layer 206 via the above-described wafer-bonding process, where the wafer-bonding process is different from a deposition process or a growth process. Thus, the bonding process of FIG. 2B may occur after the formation of the amorphous layer 206 substantially over the oxide layer 204, where the amorphous layer 206 may be deposited or grown over the oxide layer 204 and may not be deposited or grown over the seed wafer 208. The bonding process of FIG. 2B may utilize only a coarse alignment of the seed wafer 208 with the structure including the amorphous layer 206, the oxide layer 204, and the substrate 202. The coarse alignment procedure may be in contrast to a precision alignment that may be used in other techniques for producing a semiconductor-on-insulator structure.

Figure 2C:
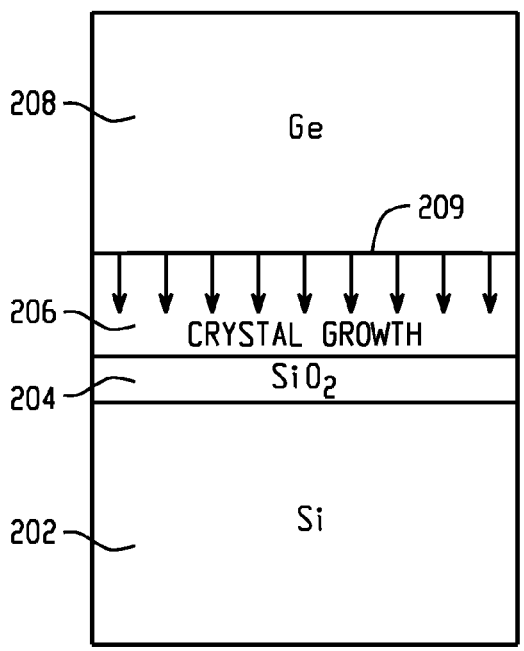
FIG. 2C depicts an annealing used to recrystallize the amorphous semiconductor layer using a crystalline semiconductor structure of the seed wafer as a crystal template, in accordance with some embodiments.

FIG. 2C depicts an annealing process used to recrystallize the amorphous semiconductor layer 206 using a crystalline semiconductor structure of the seed wafer 208 as a crystal template, in accordance with some embodiments. In FIG. 2C, following the bonding of the seed wafer 208 to the amorphous layer 206, as depicted in FIG. 2B, a bonding interface 209 may exist between the seed wafer 208 and the amorphous layer 206. The annealing may enable a solid-phase epitaxial regrowth process to occur in the amorphous layer 206, where the solid-phase epitaxial regrowth process may be used to recrystallize the amorphous layer 206. The solid-phase epitaxial regrowth process may use the crystalline semiconductor structure of the seed wafer 208 as a crystal template in crystallizing the amorphous layer 206. In certain examples, the amorphous layer 206 may be doped with impurities to facilitate or accelerate the solid-phase epitaxial regrowth process.

As depicted in FIG. 2C, the recrystallization process may begin from the bonding interface 209 and may thereafter proceed downward through an entirety of a thickness of the amorphous layer 206. As described above with reference to FIG. 1, such a recrystallization process beginning from the foreign seed wafer 208 that is located above the amorphous layer 206 may be termed a "top-down" regrowth process (e.g., in contrast to conventional, "bottom-up" regrowth processes that may use a seed crystal of a non-foreign layer located beneath the layer to be recrystallized). In the top-down regrowth process of FIG. 2C, because the seed wafer 208 is not located at a bottom of the structure (e.g., the seed wafer 208 is a foreign wafer that is not used to provide structural support for the structure), the seed wafer 208 may be debonded and reused (e.g., as described below with reference to FIGS. 2E and 2G), such that the stacking and regrowth process can be repeated multiple times.

The solid-phase epitaxial growth process may use an annealing process, where the structure including the seed wafer 208, the amorphous layer 206, the oxide layer 204, and the substrate 202 are annealed. Specifically, the annealing process may utilize a low temperature that does not cause damage to the structure or to devices formed in the structure. The temperature of the annealing process may be lower than that used in certain conventional fabrication techniques (e.g., conventional fabrication techniques for stacking a single active layer on top of a chip that use hydrogen implant and splitting processes and use high temperature annealing that may be damaging to devices or metal layers used in the devices).

In one example, the amorphous layer 206 may include an amorphous germanium layer and the seed wafer 208 may include a crystalline germanium wafer (i.e., as depicted in the example of FIG. 2C), and an annealing temperature for the solid-phase epitaxial regrowth may be within a range of approximately 400 to 600 degrees Celsius. In another example, the amorphous layer 206 may include an amorphous silicon layer and the seed wafer 208 may include a crystalline silicon wafer, and an annealing temperature for the solid-phase epitaxial regrowth may be within a range of approximately 550 to 650 degrees Celsius. The low temperature of the annealing process may facilitate debonding of the seed wafer 208 from the amorphous layer 206.

Figure 2D:
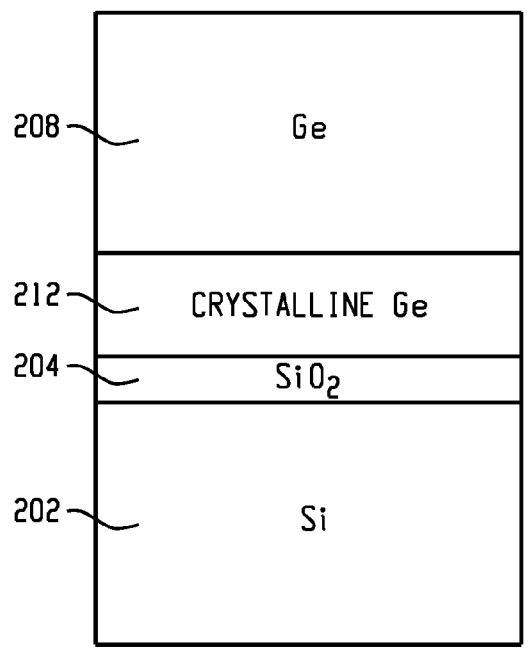
FIG. 2D depicts a crystalline semiconductor layer formed as a result of a solid-phase epitaxial regrowth process, in accordance with some embodiments.

FIG. 2D depicts a crystalline semiconductor layer 212 formed as a result of the solid-phase epitaxial regrowth process, in accordance with some embodiments. The crystalline semiconductor layer 212 may be a single-crystal semiconductor layer that is formed on the oxide layer 204. Although the example of FIG. 2D depicts a creation of a crystalline germanium layer, the crystalline semiconductor layer 212 may be comprised of various other semiconductor materials and semiconductor alloy materials. As described above, for example, the crystalline semiconductor layer 212 may be comprised of crystalline silicon. The crystalline semiconductor layer 212 may be of various different crystal orientations. For example, the seed wafer 208 used for the solid-phase epitaxial regrowth process may be a silicon wafer (e.g., having a (100), (110), or (111) crystal orientation) or a sapphire wafer having various crystal orientations. The regrowth process may cause the crystalline semiconductor layer 212 to take on the crystal orientation of the seed wafer 208 and may thus allow the crystalline semiconductor layer 212 to have a variety of different crystal orientations.

In one example, a relaxed SiGe seed wafer 208 may be used in the recrystallization process, where the SiGe seed wafer 208 may be used to recrystallize either amorphous silicon or amorphous germanium. Specifically, when using the SiGe seed wafer 208, recrystallizing an amorphous silicon layer or an amorphous germanium layer may cause stress or strain in the resulting crystalline silicon layer or crystalline germanium layer. For example, a resulting crystalline silicon layer 212 formed using the relaxed SiGe seed wafer 208 may be under tensile stress, where the tensile stress may increase electron mobility in the crystalline silicon layer 212. As another example, a resulting crystalline germanium layer 212 formed using the relaxed SiGe seed wafer 208 may be under compressive stress, where the compressive stress may increase hole mobility in the crystalline germanium layer 212. Various other combinations of seed layer 208 materials and amorphous layer 206 materials may be selected such that the resulting crystalline semiconductor layer 212 may have a level of stress or strain.

Figure 2E:
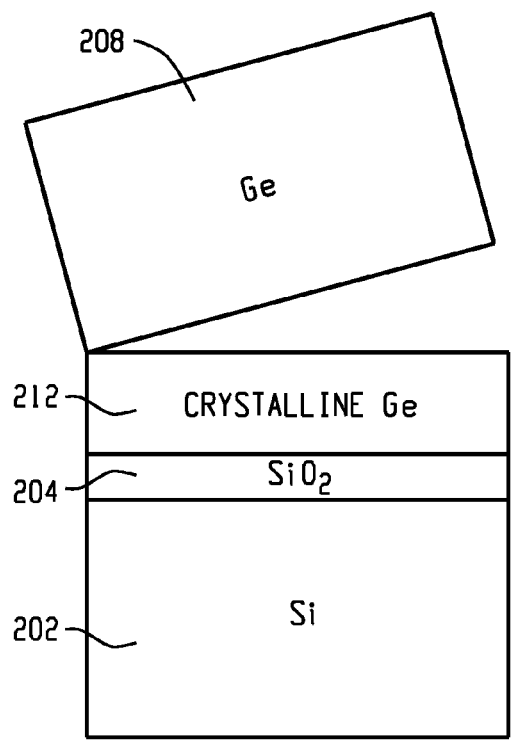
FIG. 2E depicts the seed wafer being debonded from the structure, in accordance with some embodiments.
Figure 2F:
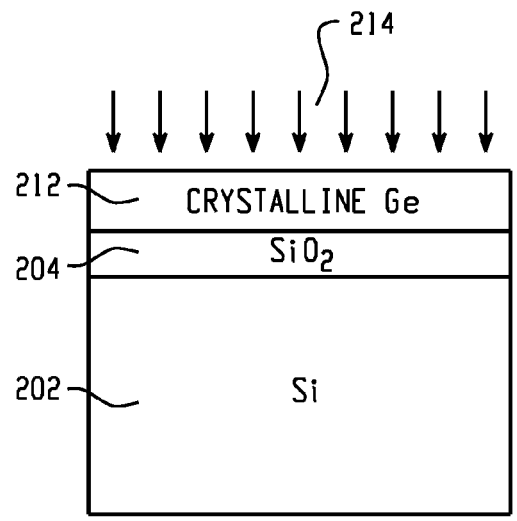
FIG. 2F depicts a chemical mechanical planarization (CMP) process being performed on the structure, in accordance with some embodiments.

FIG. 2E depicts the seed wafer 208 being debonded from the structure, in accordance with some embodiments. As described above, the bond strength between the seed layer 208 and the crystalline semiconductor layer 212 may be such that atomically-intimate contact is formed between the layers 208, 212, while still allowing the seed wafer 208 to be debonded following the solid-phase epitaxial regrowth process. Thus, as depicted in FIG. 2E, the seed wafer 208 may be debonded from the crystalline semiconductor layer 212 using various conventional debonding techniques.

Steps may be taken in the fabrication process to enable easier debonding of the seed wafer 208. For example, prior to the bonding of the seed wafer 208, the amorphous layer 206 may be patterned (e.g., into chips) to facilitate recrystallization and debonding. For example, lines may be patterned into the amorphous layer 206, where the lines are areas in which the amorphous material is removed (e.g., trenches). The lines of the removed amorphous material in the amorphous layer 206 may not reach a bottom of the amorphous layer 206 (i.e., the lines may not extend to the substrate 202). Alternatively, the patterned lines may be in the seed wafer 208 instead of in the amorphous layer 206. As another example of a step that may be taken in the fabrication process to facilitate debonding of the seed wafer 208, special treatment may be applied at a wafer rim of the amorphous layer 206. Alternatively, the special treatment may be applied to the rim of the seed wafer 208. The special treatment may include, for example, local bonding deactivation or recessing of the amorphous layer 206 (e.g., via the lines that include areas in which the amorphous material is removed, as described above). As another example, ions such as H, F, He, or Cl may be introduced in the amorphous layer 206 (e.g., via an ion implantation technique) to facilitate debonding of the seed layer 208.

FIG. 2F depicts a chemical mechanical planarization (CMP) process 214 being performed on the structure, in accordance with some embodiments. The CMP process 214 may be performed following the debonding process of FIG. 2E, where the CMP process 214 may be used to planarize, smooth (e.g., eliminate surface roughness), and thin the crystalline semiconductor layer 212 or remove impurities present on a surface of the crystalline semiconductor layer 212 following the debonding process. As illustrated in FIG. 2F, the resulting structure may comprise a semiconductor-on-insulator structure.

Figure 2G:
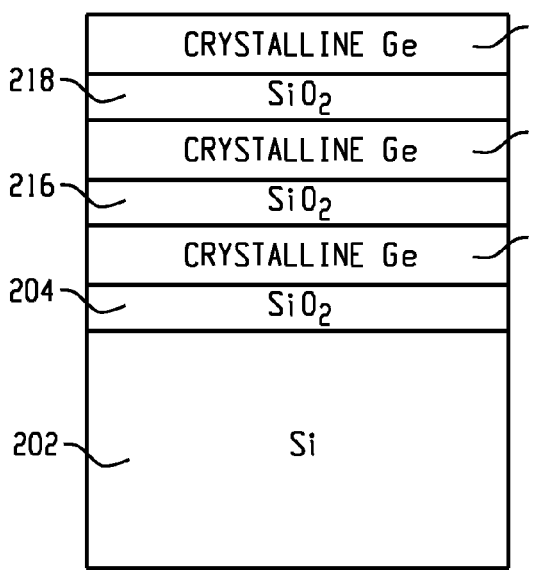
FIG. 2G depicts the structure including a stack of layers, where the stack includes a succession of insulator layers and semiconductor layers, in accordance with some embodiments.

FIG. 2G depicts the structure including a stack of layers, where the stack includes a succession of insulator layers 204, 216, 218 and semiconductor layers 212, 220, 222, in accordance with some embodiments. The structure of FIG. 2G may be the result of repeating the steps described above with reference to FIGS. 2A-2F. Thus, after performing the debonding depicted in FIG. 2E and the optional CMP process 214 depicted in FIG. 2F, a second oxide layer 216 may be formed substantially over the crystalline semiconductor layer 212. A second amorphous layer 220 may be formed substantially over the second oxide layer 216. A second seed wafer (not depicted in FIG. 2G) may be bonded to the second amorphous layer 220, where the second seed wafer may include a crystalline semiconductor structure. A second annealing process may be performed to crystallize the second amorphous layer 220, where the second annealing process may use the crystalline semiconductor structure of the second seed wafer as a crystal template. Following the second annealing process, the second seed wafer may be debonded from the structure. These steps may be repeated in a similar manner to form a third oxide layer 218 and a third semiconductor layer 222. As described above, only coarse alignment may be utilized in forming the stack, thus potentially overcoming issues caused by the precise alignment of conventional fabrication techniques.

The bonding, epitaxial regrowth, and debonding steps described above with reference to FIGS. 2A-2G may be repeated at will to form a stack comprising a succession of insulator layers and crystalline semiconductor layers. In forming the stack, the seed layer may be reused one or more times (i.e., in the example of FIG. 2G, the second seed wafer may be the same as the seed wafer 208). Alternatively, to form crystalline semiconductor layers 212, 220, 222 of different crystal orientations or different stress and strain levels, for example, the second seed layer may be different from the seed layer 208.

The amorphous materials that are recrystallized to form the crystalline semiconductor layers 212, 220, 222 may be varied between the layers 212, 220, 222. For example, although the example of FIG. 2G depicts the stack having crystalline semiconductor layers 212, 220, 222 that are each comprised of germanium, in another example, the layers 212, 222 may be comprised of silicon, and the layer 220 may be comprised of germanium. Any number of other combinations of seed layer materials and amorphous layer materials may be used.

Figure 3:
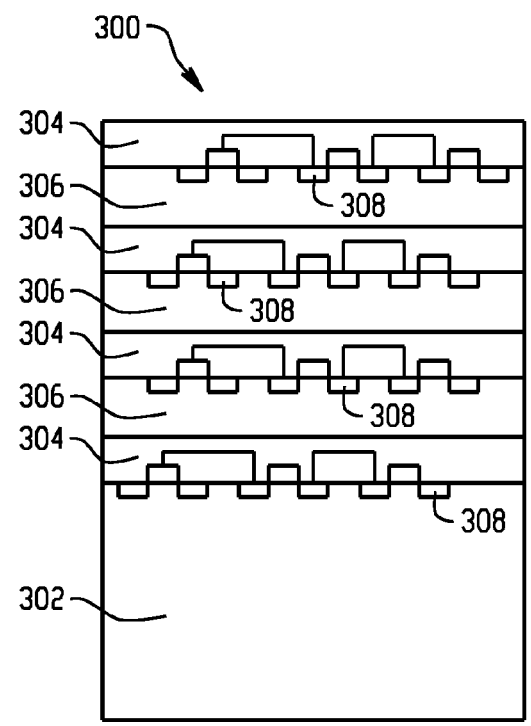
FIG. 3 depicts an example structure including a succession of insulator layers and semiconductor layers, where certain of the layers include devices formed therein, in accordance with some embodiments.

FIG. 3 depicts an example structure 300 including a succession of insulator layers 304 and semiconductor layers 306, where certain of the layers 304, 306 include devices 308 formed therein, in accordance with some embodiments. The succession of insulator layers 304 and semiconductor layers 306 may be fabricated on a substrate 302 in a manner that is similar to that described above with reference to FIGS. 2A-2G. In FIG. 3, the devices 308 (e.g., transistors) have been fabricated in the layers 304, 306, and various of the devices of the layers 304, 306 may be connected by inter-level vias and by electrical connections within a single layer. An Nth layer may be processed (e.g., to fabricate a device 308 in the Nth layer) before adding an (N+1)th layer.

For example, after fabricating a lowest semiconductor layer 306, the lowest semiconductor layer 306 may be processed to fabricate one or more devices 308 in the layer 306. Thereafter, a subsequent insulator layer 304 and a subsequent semiconductor layer 306 may be formed substantially over the lowest semiconductor layer 306. Because the annealing process used to form the subsequent semiconductor layer 306 may be a low temperature process (e.g., within a range of approximately 300-350 degrees Celsius to fabricate the subsequent semiconductor layer 306 to be crystalline germanium, and within a range of approximately 550-650 degrees Celsius to fabricate the subsequent semiconductor layer 306 to be crystalline silicon), the devices formed in the lowest semiconductor layer 306 may not be damaged by the temperatures used to form the subsequent semiconductor layer 306.

Figure 4:
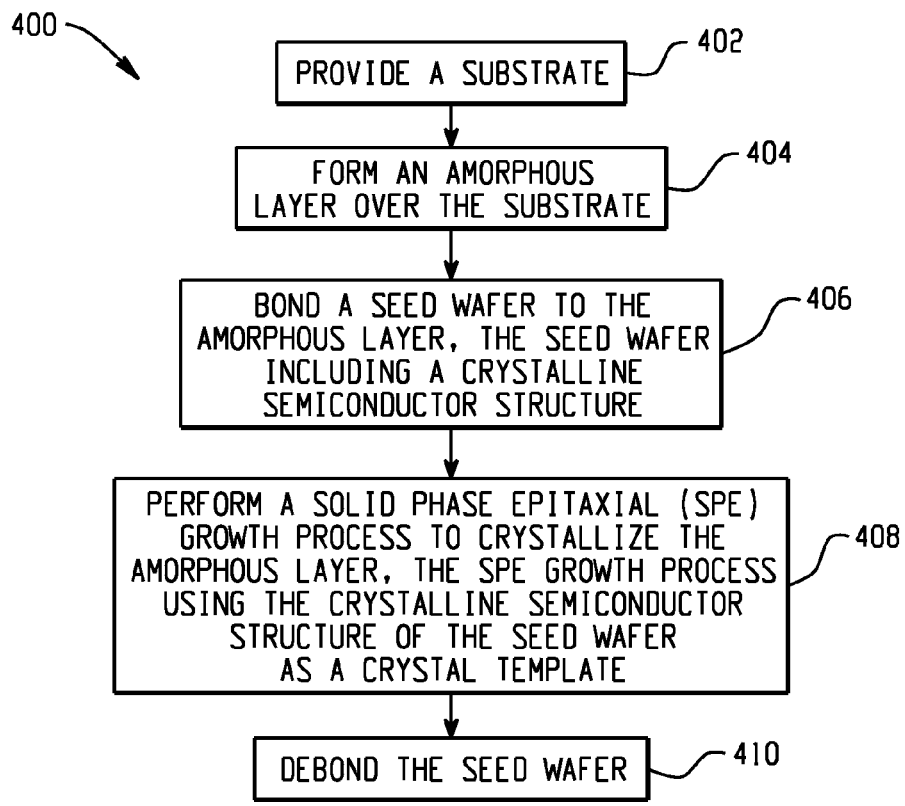
FIG. 4 is a flowchart illustrating an example method for forming a layer of semiconductor material, in accordance with some embodiments.

FIG. 4 is a flowchart 400 illustrating an example method for forming a layer of semiconductor material, in accordance with some embodiments. At 402, a substrate is provided. At 404, an amorphous layer is formed over the substrate, where the amorphous layer includes a semiconductor or a semiconductor alloy. At 404, a seed wafer is bonded to the amorphous layer, where the seed wafer includes a crystalline semiconductor structure. At 406, a solid-phase epitaxial (SPE) growth process is performed to crystallize the amorphous layer, where the SPE growth process uses the crystalline semiconductor structure of the seed wafer as a crystal template. At 408, the seed wafer is debonded from the structure.

Figure 5:
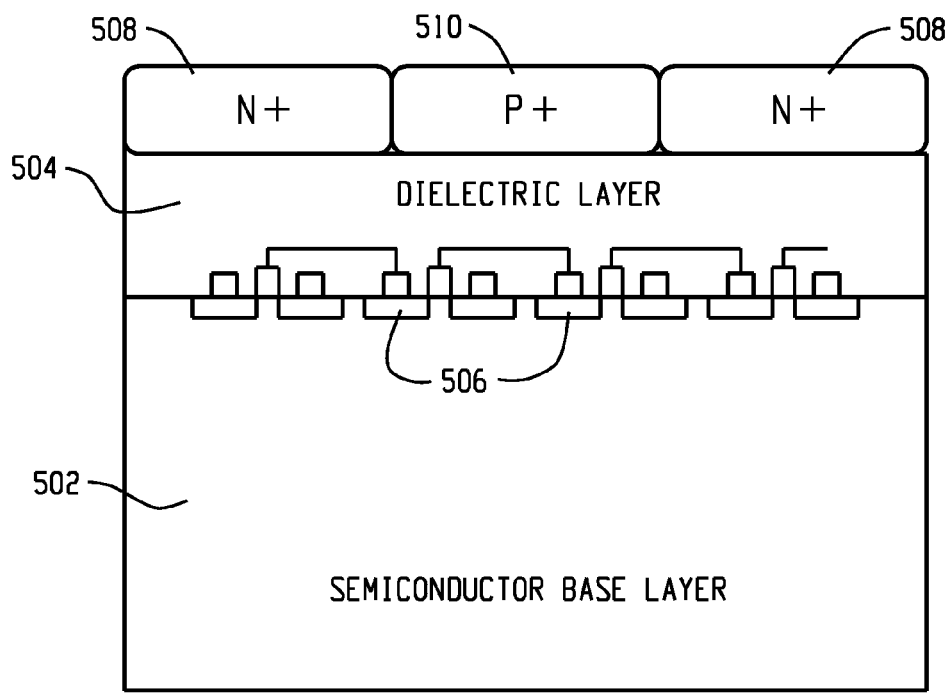
FIG. 5 depicts an example semiconductor-on-insulator (SOI) structure formed using a solid-phase epitaxial (SPE) growth process, in accordance with some embodiments.

FIG. 5 depicts an example semiconductor-on-insulator (SOI) structure formed using a solid-phase epitaxial (SPE) growth process, in accordance with some embodiments. In the example of FIG. 5, a combination of a bonding process and the SPE growth process may be used to form a single-crystal semiconductor layer including N-type conductivity regions 508 and P-type conductivity regions 510 substantially over a dielectric (i.e., insulating) layer 504. As described in further detail below, with reference to FIGS. 6A-6K, the bonding and SPE growth processes may be used to fabricate a stack comprising a succession of alternating layers of insulator and semiconductor materials, and this succession of layers may be used to form a three-dimensional (3D) monolithic integrated circuit.

In fabricating the SOI structure of FIG. 5 using the combination of the bonding and SPE growth processes, a substrate may be provided. The substrate may include a semiconductor base layer 502 and the dielectric layer 504, where the layers 502, 504 may have one or more devices or features 506 formed therein. Thus, in an example, the substrate including the layers 502, 504 may be an existing semiconductor wafer that has been previously processed to form the one or more devices or features 506 therein. The dielectric layer 504 may be an interlayer dielectric (ILD) layer comprising, for example, a silicon oxide layer, a silicon dioxide layer, or a layer of another insulating material. The substrate 502 may be, for example, a bulk silicon substrate or another semiconductor substrate. The one or more devices or features 506 formed in the substrate may be, for example, transistors or other devices.

A seed layer may be used in forming the structure illustrated in FIG. 5. For example, as described in further detail below with reference to FIGS. 6A-6K, a seed layer may be bonded to the substrate, and the seed layer may be processed to form the resulting N- and P-type conductivity regions 508, 510. The bonding of the seed layer to the substrate may be performed without a need for alignment. In an example, the seed layer may include a crystalline semiconductor structure (e.g., a crystalline silicon layer having a (100), (110), (111), or other crystal orientation, a sapphire layer, a crystalline germanium layer, a crystalline SiGe layer, etc.) and may have a relatively low thickness that causes the one or more devices or features 506 to be visible through the seed layer. Thus, the seed layer may be a relatively thin crystalline semiconductor layer that is transparent. As described below, the relatively low thickness of the seed layer may allow for precise alignment of features formed in the N- and P-type conductivity regions 508, 510 with the underlying one or more devices or features 506 of the substrate. For example, alignment marks may be formed in the seed layer using the underlying one or more devices or features 506 as an alignment reference. The alignment marks may be used in forming the N- and P-type conductivity regions 508, 510 and/or in patterning device features in the N- and P-type conductivity regions 508, 510.

A bottom portion of the seed layer may be amorphized using a semiconductor ion implantation process or another suitable amorphizing process. The bottom portion of the seed layer may be a portion of the seed layer that is adjacent to an uppermost portion of the dielectric layer 504. A top portion of the seed layer that is not adjacent to the uppermost portion of the dielectric layer 504 may not be amorphized and may retain the crystalline semiconductor structure. Thus, following the amorphization of the bottom portion of the seed layer, the seed layer may include a crystalline portion that is substantially over a non-crystalline portion. In processing the seed layer including the crystalline and non-crystalline portions, a dopant implantation may be used to dope the non-crystalline portion of the seed layer, which may cause the non-crystalline portion of the seed layer to have the N+ and P+ conductivity types, as illustrated in regions 508, 510 of FIG. 5. The N+ and P+ conductivity types may have majority carrier concentrations on the order of $1 \times 10^{19}$ carriers/cm$^3$, in an example.

A solid-phase epitaxial (SPE) growth process (which may also be referred to herein as a "regrowth" process) may be performed to crystallize the non-crystalline portion of the seed layer (i.e., the bottom portion of the seed layer that is adjacent to the uppermost portion of the dielectric layer 504). The growth process may use the crystalline semiconductor structure of the crystalline portion of the seed layer as a crystal template. Thus, the SPE growth process may begin at an interface between the crystalline portion of the seed layer and the non-crystalline portion of the seed layer, and may proceed downward through an entirety of a thickness of the non-crystalline portion of the seed layer. In an example, the SPE growth process may include a low-temperature annealing process that is performed at a temperature that is less than 500 degrees Celsius. Generally, the low-temperature of the SPE growth process may be a temperature that does not cause damage to the one or more devices or features 506 of the underlying substrate.

After performing the SPE growth process, the portion of the seed layer used as a crystal template (i.e., the crystalline portion of the seed layer used in crystallizing the non-crystalline portion of the seed layer) may be removed from the structure. Following the removal of this portion of the seed layer, the structure may resemble the structure depicted in FIG. 5, which includes the N- and P-type conductivity regions 508, 510 that may be formed in the bottom portion of the seed layer that was amorphized and recrystallized as described above. The N- and P-type conductivity regions 508, 510 formed in the bottom portion of the seed layer may be patterned to make junctionless field effect transistors (FETs), as described below with reference to FIGS. 6A-7B. The junctionless FETs may be created without a need for a significant thermal annealing step. The relatively low temperature process used to create the junctionless FETs may prevent devices formed in underlying layers (e.g., the one or more devices or features 506 formed in the substrate) from being damaged by the processing temperatures used in fabricating the junctionless FETs.

After depositing a second ILD layer substantially over the junctionless FET devices, the steps described above may be repeated one or more times to form a succession of insulator layers and single-crystal semiconductor layers including devices formed therein. In this manner, a stack of alternating insulator/semiconductor material layers may be formed, and the stack of alternating layers may be used to fabricate three-dimensional (3D) monolithic integrated circuits. In an example, the stack of alternating layers may include a variety of different types of semiconductor materials (e.g., silicon, germanium, and SiGe materials may be used at different layers within a single stack). In other examples, the stack may include semiconductor materials with different crystal orientations and/or different levels of strain. Similar to the example described above with reference to FIGS. 1-4, the solid-phase epitaxial growth process described below with reference to FIGS. 6A-9 may be a "top-down" growth process, where the crystal template for the growth process may be located in an upper portion of the seed layer that is used to crystallize the amorphous bottom portion of the seed layer.

The process described herein with reference to FIGS. 5-9 may be in contrast to conventional techniques for forming a 3D monolithic integrated circuit. For example, the process described herein with reference to FIGS. 5-9 may allow for standard transistor architectures to be formed in both of the N- and P-type conductivity regions 508, 510. By contrast, in the conventional techniques, standard transistor architectures may not be achievable, and further, any structures formed may be limited to one polarity (i.e., N-channel or P-channel) per tier.

FIG. 6A depicts a bonding of a seed layer 606 to a substrate, in accordance with some embodiments. In FIG. 6A, the substrate may include i) a semiconductor base layer 601, and ii) a dielectric layer 604 that is formed substantially over the semiconductor base layer 601. In an example, the semiconductor base layer 601 may be a processed silicon wafer including one or more devices or features formed therein. The semiconductor base layer 601 may be, for example, a bulk silicon substrate or another semiconductor substrate with the one or more devices or features formed therein. The dielectric layer 604 may be, for example, a silicon oxide layer, a silicon dioxide layer, or a layer comprising another insulating material. In an example, the dielectric layer 604 may be an interlayer dielectric (ILD) layer used to provide electrical isolation for the one or more devices or features formed in the substrate.

The seed layer 606 may be bonded to the substrate, where the bonding may be performed at a low temperature. In an example, the bonding of the seed layer 606 to the substrate may be performed at a temperature that is less than 400 degrees Celsius. In another example, the bonding of the seed layer 606 to the substrate may be performed at a temperature that is less than 600 degrees Celsius. In general, the bonding of the seed layer 606 to the substrate may be performed at a low temperature that does not cause damage to or adversely affect the one or more devices or features formed in the substrate. Each of the steps described herein with reference to FIGS. 6A-6K may be performed at a low temperature that does not cause damage to the one or more devices or features formed in the substrate. Such low temperature processing may enable the stacking of several device layers, with the addition of each layer including low temperature processing that does not cause damage to previously formed device layers.

Figure 6E:
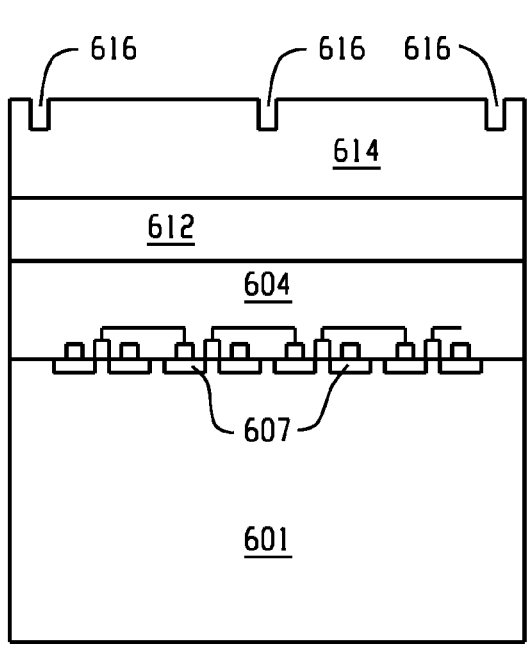
FIG. 6E depicts a formation of alignment marks on the seed layer, in accordance with some embodiments.

As illustrated in FIG. 6A, in bonding the seed layer 606 to the substrate, specifically, the seed layer 606 may be bonded to the dielectric layer 604 of the substrate. In the example of FIGS. 6A-6K, the seed layer 606 may include a crystalline semiconductor structure that comprises, for example, a crystalline germanium layer, a crystalline silicon layer having a (100), (110), (111), or another crystal orientation, a crystalline SiGe layer, or a layer of another crystalline material with suitable crystal lattice parameters. The seed layer 606 may be part of a semiconductor-on-insulator (SOI) or a hydrogen-implanted wafer. For example, as illustrated in the example of FIG. 6A, the seed layer 606 may be part of an SOI wafer that includes the crystalline seed layer 606, a second dielectric layer 608, and a second semiconductor base layer 610. The second dielectric layer 608 may be, for example, a silicon dioxide ($SiO_2$) layer, a silicon oxide layer, or a dielectric layer formed of another material. The second semiconductor base layer 610 may be, for example, bulk silicon layer or another relatively thick semiconductor layer.

In bonding the SOI wafer to the substrate, an interface may be formed between the seed layer 606 and the dielectric layer 604 of the substrate. Various surface treatments may be applied to the SOI wafer and/or the substrate to facilitate the bonding. For example, a CMP process may be used to planarize and smoothen the seed layer 606 prior to the bonding, and the seed layer 606 may also be cleaned to remove a native oxide layer on the seed layer 606. Similar CMP and cleaning processes may be applied to the dielectric layer 604 of the substrate. The CMP and cleaning processes that may be applied to the dielectric layer 604 and the seed layer 606 may be performed to improve a quality of a bond between the dielectric layer 604 and the seed layer 606 (e.g., to achieve an atomic contact between the layers).

The bonding process illustrated in FIG. 6A may further utilize, for example, a hydrogen plasma, hydrofluoric acid (HF), hydrochloric acid (HCl), or hydrobromic acid (HBr) treatment for passivation or activation of the bonding surfaces. In the example of FIG. 6A, the seed layer 606 may become connected to the dielectric layer 604 via the above-described wafer-bonding process, where the wafer-bonding process is different from a deposition process or a growth process. The bonding process of FIG. 6A may utilize only a coarse alignment of the SOI wafer with the substrate. The coarse alignment procedure may be in contrast to a precision alignment that may be used in other conventional techniques for producing a semiconductor-on-insulator structure.

FIG. 6B depicts a removal of a portion of the SOI wafer from the substrate, in accordance with some embodiments. As described above with reference to FIG. 6A, the bonding of the seed layer 606 to the substrate may include bonding a SOI wafer to the substrate, where the SOI wafer includes the seed layer 606, the second dielectric layer 608, and the second semiconductor base layer 610. In FIG. 6B, after the bonding of the SOI wafer to the substrate, the second dielectric layer 608 and the second semiconductor base layer 610 may be removed from the structure. In an example, the second semiconductor base layer 610 may be removed by etch-back and/or polishing techniques. The second dielectric layer 608 may be removed by etching (e.g., a wet etch or a dry etch). For example, the second dielectric layer 608 may be a silicon dioxide layer that is removed using a wet etch technique involving hydrofluoric acid (HF). As illustrated in the example of FIG. 6B, the removal of the second dielectric layer 608 and the second semiconductor base layer 610 may not remove an entirety of the seed layer 606 from the substrate.

FIG. 6C depicts a cross-sectional view of the structure following the removal of the portion of the SOI structure from the substrate, the structure including devices 607 formed in the substrate, in accordance with some embodiments. As explained above with reference to FIG. 6A, the substrate including the semiconductor base layer 601 and the dielectric layer 604 may include one or more devices or features formed therein. An example of such one or more devices or features is illustrated in FIG. 6C, which includes devices 607 formed in the semiconductor base layer 601 and dielectric layer 604. The devices 607 may include, for example, i) transistors, and ii) metal lines that provide electrical connections for various portions of the transistors.

A metal used for the devices 607 may be a metal that can withstand relatively high temperatures, such as tungsten. The use of tungsten or another similar metal may reflect the fact that additional device layers may be provided over the layer 604. In forming the additional device layers, relatively low temperatures (e.g., less than 500 degrees Celsius) may be used, as described below. Tungsten or another similar metal may be able to withstand such relatively low temperatures, such that the devices 607 may not be damaged or adversely affected during the formation of the additional device layers.

The seed layer 606 may be a relatively thin crystalline semiconductor layer, such that a thickness of the seed layer 606 may allow the devices 607 of the substrate to be visible through the seed layer 606. As described below with reference to FIGS. 6D-6K, features formed in upper layers of the structure may be precisely aligned with the devices 607 of the substrate due to the transparent nature of the relatively thin seed layer 606.

FIG. 6D depicts an example amorphizing of a first portion 612 of the seed layer 606, in accordance with some embodiments. As illustrated in FIG. 6D, the first portion 612 of the seed layer 606 that is amorphized may be adjacent to an interface between the seed layer 606 and the dielectric layer 604 of the substrate. A second portion 614 of the seed layer 606 that is not adjacent to the interface between the seed layer 606 and the dielectric layer 604 may not be amorphized and thus may maintain the crystalline semiconductor structure of the seed layer 606 described above. In the example of FIG. 6D, the second portion 614 of the seed layer 606 may be adjacent to the first portion 612 of the seed layer 606, and the first and second portions 612, 614 may occupy an entirety of a thickness of the seed layer 606.

The amorphization of the first portion 612 of the seed layer 606 may utilize, for example, a blanket ion implantation process. As explained above, the seed layer 606 may comprise (prior to the amorphization), a crystalline Si layer, a crystalline Ge layer, or a crystalline SiGe layer, such that the amorphizing of the first portion 612 of the seed layer 606 may change the first portion 612 into an amorphous Si, Ge, or SiGe layer. The amorphization may be performed using ion implantation with ions of the same species as the seed layer 606. Thus, for example, when the seed layer 606 comprises a crystalline silicon layer, the ion implantation used to amorphize the seed layer 606 may utilize silicon ions. Similarly, when the seed layer 606 comprises a crystalline germanium layer, the ion implantation used to amorphize the seed layer 606 may utilize germanium ions. In other examples, ions that are not of the same species as the seed layer 606 may be used. For example, Ar or Kr ions may be used in amorphizing the seed layer 606 that may comprise Si, Ge, or SiGe. In other examples, germanium ions may be used in amorphizing a silicon seed layer 606, or silicon ions may be used in amorphizing a germanium seed layer 606. Any type of implantation that causes an amorphization of the first portion 612 of the seed layer 606 may be used in other examples.

FIG. 6E depicts a formation of alignment marks 616 on the seed layer 606, in accordance with some embodiments. In FIG. 6E, locations of the alignment marks 616 may be based on the devices 607 (i.e., the one or more devices or features) formed in the substrate. As explained above, the seed layer 606 (comprising the amorphized first portion 612 and the crystalline second portion 614 following the amorphizing described above with reference to FIG. 6D) may have a thickness that causes the devices 607 to be visible through the seed layer 606. Thus, in forming the alignment marks 616, because the portions 612, 614 of the seed layer 606 may be transparent, the alignment marks 616 may be positioned with reference to the underlying devices 607.

In another example, the formation of the alignment marks 616 may occur before the amorphizing of the first portion 612 of the seed layer 606. Thus, although FIG. 6D may illustrate the amorphizing of the first portion 612 of the seed layer 606 as occurring before the formation of the alignment marks 616 in FIG. 6E, these steps may be reversed in other examples. Further, in other examples, the alignment marks 616 may not be formed. As described in further detail below, the alignment marks 616 may not be utilized due to the transparent nature of the relatively thin seed layer 606. Thus, for example, in forming devices or features in an upper layer that is formed substantially over the substrate, the underlying devices 607 may continue to be visible and may be used in determining positions of the devices or features in the upper layer.

Figure 6F:
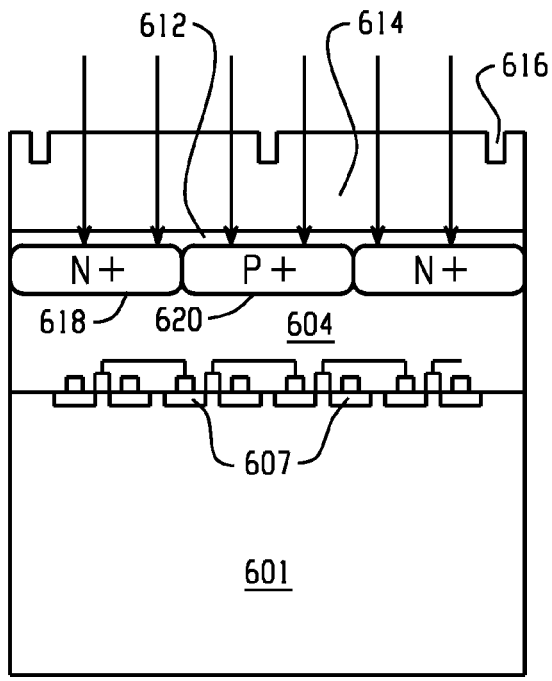
FIG. 6F depicts a dopant implantation to form N-type conductivity regions and P-type conductivity regions in the first portion of the seed layer, in accordance with some embodiments.

FIG. 6F depicts a dopant implantation to form N-type conductivity regions 618 and P-type conductivity regions 620 in the first portion 612 of the seed layer 606, in accordance with some embodiments. In the example of FIG. 6F, where the seed layer 606 may comprise Si, Ge, or SiGe, among other materials, the N-type conductivity regions 618 may be formed by doping the seed layer 606 with an N-type dopant such as phosphorous or arsenic, and the P-type conductivity regions 620 may be formed by doping the seed layer 606 with a P-type dopant such as boron or aluminum. Although the example of FIG. 6F illustrates formation of both N- and P-type regions 618, 620 in the amorphized first portion 612 of the seed layer 606, in other examples, a single dopant type may be used. Thus, in such other examples, N-type dopants may be used to form an N-type region in the amorphized first portion 612, and a P-type region may not be formed therein. Alternatively, in other examples, P-type dopants may be used to form a P-type region in the amorphized first portion 612, and an N-type region may not be formed therein. Further, although FIG. 6F may depict two N-type conductivity regions 618 and one P-type conductivity region 620, it should be understood that any number of different N- and P-type regions 618, 620 may be formed. For example, multiple N-type conductivity regions 618 and multiple P-type conductivity regions 620 may be formed within the first portion 612.

In the example of FIG. 6F, locations of the N- and P-type conductivity regions 618, 620 may be determined using the alignment marks 616. Alternatively, because the seed layer 606 may have a thickness that causes the devices 607 to be visible through the seed layer 606, locations of the N- and P-type regions 618, 620 may be determined based on the devices 607 that are visible through the seed layer 606. In such an example, the locations of the N- and P-type conductivity regions 618, 620 may be determined without forming the alignment marks 616 on the seed layer 606. The ability to form the N- and P-type conductivity regions 618, 620 without the need for the alignment marks 616 may also reflect the fact that the N- and P-type conductivity regions 618, 620 are relatively large, such that a coarse alignment may be adequate to align such relatively large regions 618, 620 with the devices 607 of the substrate.

Figure 6G:
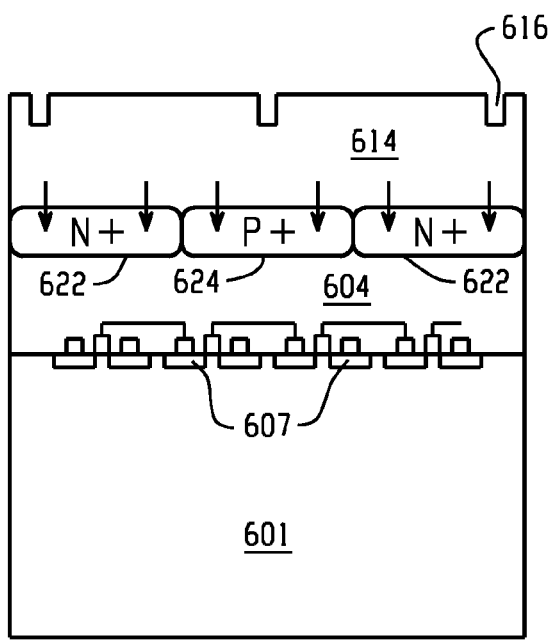
FIG. 6G depicts a solid-phase epitaxial (SPE) growth process used to crystallize the first portion of the seed layer, in accordance with some embodiments.

FIG. 6G depicts a solid-phase epitaxial (SPE) growth process used to crystallize the first portion 612 of the seed layer 606, in accordance with some embodiments. In FIG. 6G, following the dopant implantation described above with reference to FIG. 6F, the SPE growth process may crystallize the first portion 612 of the seed layer 606 using the crystalline semiconductor structure of the second portion 614 of the seed layer 606 as a crystal template. The SPE growth process may utilize a low-temperature annealing process that recrystallizes the first portion 612. As illustrated in FIG. 6G, the SPE growth process may be used to form N- and P-type regions 622, 624 that comprise single crystal N- and P-type regions. Such single crystal regions 622, 624 may be in contrast to the amorphous N- and P-type regions 618, 620 of FIG. 6F.

Following the amorphization of the first portion 612 of the seed layer 606 (i.e., as described above with reference to FIG. 6D), an interface may exist between the first and second portions 612, 614 of the seed layer 606. The recrystallization process of FIG. 6G may begin at the interface between the first and second portions 612, 614 of the seed layer 606 and may thereafter proceed downward through an entirety of a thickness of the first portion 612 of the seed layer 606. As described above with reference to FIG. 5, such a recrystallization process beginning from an upper portion 614 of the seed layer 606 may be termed a "top-down" regrowth process (e.g., in contrast to conventional, "bottom-up" regrowth processes that may use a seed crystal of a layer located beneath the layer to be recrystallized).

As explained above, the SPE growth process may utilize low temperature annealing that does not cause damage to the structure or to devices formed in the structure. For example, the entire structure depicted in FIG. 6G may be annealed, and the devices 607 formed in the substrate may not be damaged or adversely affected by the low temperature of the annealing process. The temperature of the annealing process may be lower than that used in certain conventional fabrication techniques. In one example, the seed layer 606 may comprise germanium material (i.e., amorphized germanium in the first portion 612 and crystalline germanium in the second portion 614), and an annealing temperature for the SPE regrowth may be within a range of approximately 400 to 600 degrees Celsius. In another example, the seed layer 606 may comprise silicon material (i.e., amorphized silicon in the first portion 612 and crystalline silicon in the second portion 614), and an annealing temperature for the SPE regrowth may be within a range of approximately 550 to 650 degrees Celsius.

Figure 6H:
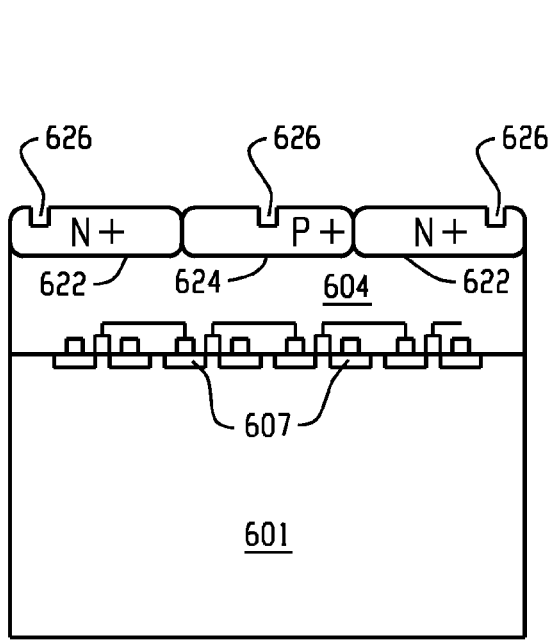
FIG. 6H depicts a removal of a second portion of the seed layer after the performing of the SPE growth process, in accordance with some embodiments.

FIG. 6H depicts a removal of the second portion 614 of the seed layer 606 after the performing of the SPE growth process, in accordance with some embodiments. In FIG. 6H, the second portion 614 of the seed layer 606 may be removed using an etching procedure, a chemical mechanical polishing (CMP) (i.e., chemical mechanical planarization) procedure, or another suitable procedure. The etching procedure may be, for example, a chemical etching procedure or a plasma etching procedure. Alignment marks 626 may be formed in the first portion 612 of the seed layer 606 after the removal of the second portion 614 of the seed layer 606. A location of the alignment marks 626 may be based on the devices 607 that are visible through the transparent first portion 612 of the seed layer 606.

In an example, the procedure by which the second portion 614 of the seed layer 606 is removed from the structure may affect the creation of the alignment marks 626. For example, if a CMP procedure is used to remove the second portion 614, previously formed alignment marks (e.g., alignment marks 616 as illustrated in FIGS. 6E-6G) may not be transferred to the single crystal N- and P-type regions 622, 624, and a new set of alignment marks 626 may be created based on the devices 607 that are visible through the transparent first portion 612 of the seed layer 606. By contrast, if a chemical etching or plasma etching procedure is used to remove the second portion 614, previously formed alignment marks (e.g., alignment marks 616) may be transferred to the single crystal N- and P-type regions 622, 624. In this example, the alignment marks 626 may be created through the transferring of the previously formed alignment marks, and no additional procedure for creating the alignment marks 626 may be utilized.

Figure 6I:
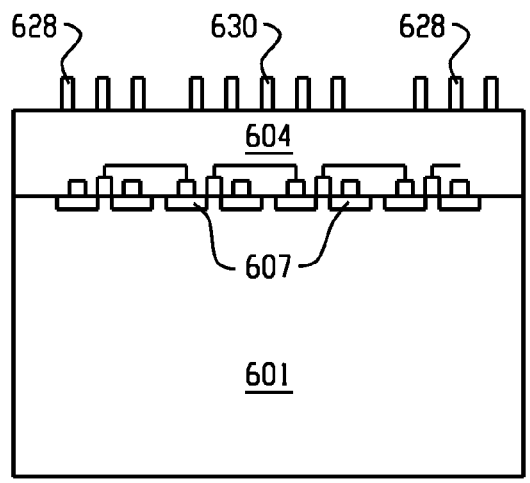
FIG. 6I depicts an example patterning of the first portion of the seed layer to form nanowires, in accordance with some embodiments.

FIG. 6I depicts an example patterning of the first portion 612 of the seed layer 606 to form nanowires (i.e., nanoribbons) 628, 630, in accordance with some embodiments. Specifically, in the example of FIG. 6I, the single crystal N- and P-type regions 622, 624 that comprise the first portion 612 of the seed layer 606 may be patterned based on the alignment marks 626. The patterning may be used to form nanowires 628, 630, where the nanowires 628 may be formed in the single crystal N-type conductivity regions 622, and the nanowires 630 may be formed in the single crystal P-type conductivity regions 624. By forming the nanowires 628, 630 based on the alignment marks 626, the nanowires 628, 630 may be aligned with the underlying devices 607 of the substrate.

The nanowires 628, 630 may be used in forming junctionless field effect transistors (FETs), as described in detail below with reference to FIGS. 7A and 7B. The junctionless FETs may thus be created without a need for significant thermal processing. Specifically, all steps described above, including the bonding of the seed layer 606 (i.e., as described above with reference to FIG. 6A), the amorphizing of the first portion 612 of the seed layer 606 (i.e., as described above with reference to FIG. 6D), the performing of the dopant implantation (i.e., as described above with reference to FIG. 6F), and the performing of the SPE growth process (i.e., as described above with reference to FIG. 6G), may be performed at low temperatures that do not cause damage to the devices 607 formed in the substrate. In one example, all processing steps may be performed at temperatures that are less than 600 degrees Celsius. Such low temperature processing may enable the stacking of several layers of such devices, with the addition of each layer comprising low temperature processing that does not cause damage to previously formed device layers.

Figure 6J:
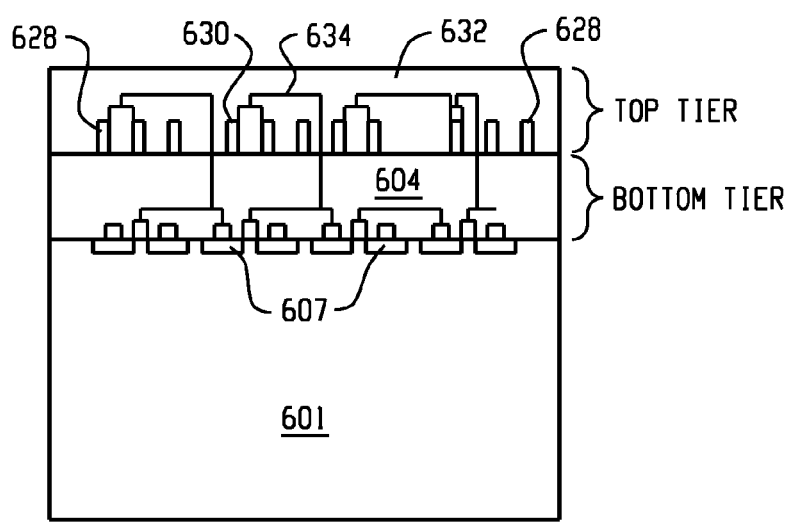
FIG. 6J depicts a formation of an interlayer dielectric (ILD) layer and a metallization process to form electrical connections, in accordance with some embodiments.

FIG. 6J depicts a formation of a dielectric layer 632 and a metallization process to form electrical connections 634, in accordance with some embodiments. The dielectric layer 632 may be an interlayer dielectric (ILD) layer that is formed around the nanowires 628, 630 and/or around the junctionless FETs formed using the nanowires 628, 630. As illustrated in FIG. 6J, the electrical connections 634 created via the metallization process may form electrical connections within a tier in which the nanowires 628, 630 are formed, and the electrical connections 634 may further form inter-tier connections between the structures and devices formed in the two different tiers.

Although the example of FIG. 6J may appear to depict the upper tier as including only the nanowires 628, 630 and the electrical connections 634, it should be understood that the upper tier may include fully formed junctionless transistors and other devices that may include junctionless transistors. As described below with reference to FIGS. 7A and 7B, after the formation of the N- and P-type regions by the implantation and low-temperature SPE growth processes, the fabrication of junctionless transistors may include the patterning of the N- and P-type regions into nanowires and the formation of gate dielectrics and gate stacks that surround portions of the nanowires. Thus, it should be understood that such junctionless transistors may be formed in the upper tier illustrated in FIG. 6J. It should further be understood that the electrical connections 634 may comprise metal lines that are used in i) connecting junctionless transistors within the upper tier, and/or ii) connecting the junctionless transistors in the upper tier with the devices 607 formed in the substrate. The dielectric layer 632 may be formed around the devices of the upper tier, and the dielectric layer 632 may provide electrical isolation for such devices.

If additional layers of devices are to be formed above the upper tier, a metal used for the electrical connections 634 may be a metal that can withstand relatively high temperatures, such as tungsten. By using tungsten or a similar metal, the devices formed in the upper tier may not be damaged or adversely affected during the formation of the additional layers of devices above the upper tier. If no additional layers are to be formed above the upper tier depicted in FIG. 6J, then another metal that is less resistant to high temperatures may be used.

Figure 6K:
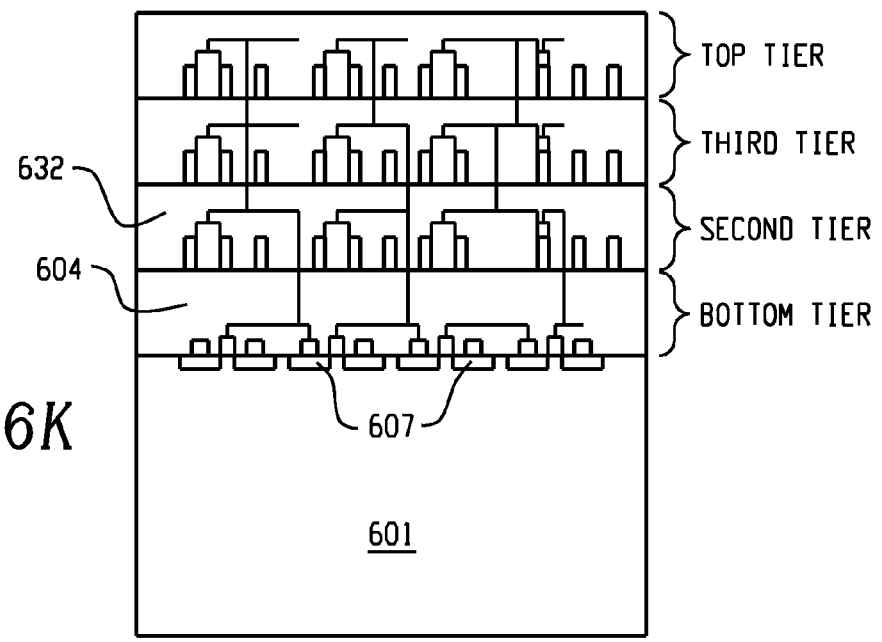
FIG. 6K depicts a resulting structure including multiple tiers of device layers, in accordance with some embodiments.

FIG. 6K depicts a resulting structure formed by repeating the process described above with reference to FIGS. 6A-6J one or more times, in accordance with some embodiments. For example, following the formation of the dielectric layer 632 (i.e., as described above with reference to FIG. 6J), a second seed layer may be bonded to the dielectric layer 632. The second seed layer may include a crystalline semiconductor structure, and the second seed layer may have a thickness that causes the devices and features formed in the dielectric layer 632 (e.g., the junctionless transistors and/or other devices described above with reference to FIG. 6J) to be visible through the second seed layer. A first portion of the second seed layer that is adjacent to an interface between the second seed layer and the dielectric layer 632 may be amorphized. A second portion of the second seed layer that is not adjacent to the interface between the second seed layer and the dielectric layer 632 may not be amorphized and may maintain the crystalline semiconductor structure.

A dopant implantation may be performed to form an N-type conductivity region or a P-type conductivity region in the first portion of the second seed layer. In another example, the dopant implantation may be used to form both N- and P-type conductivity regions that may be similar to those regions 618, 620 described above with reference to FIG. 6F. After the dopant implantation, a SPE growth process may be performed to crystallize the first portion of the second seed layer. The SPE growth process may use the crystalline semiconductor structure of the second portion of the second seed layer as a crystal template. After the SPE growth process, junctionless transistors may be formed in the recrystallized portions of the second seed layer in a manner similar to that described above with reference to FIGS. 6H-6J.

At the completion of these steps, a resulting structure may include the semiconductor base layer 601, bottom tier, second tier, and third tier depicted in FIG. 6K. A top tier depicted in FIG. 6K may be formed by substantially repeating the steps described above for forming the third tier. Additional tiers may be formed above the top tier depicted in FIG. 6K by repeating the steps one or more times. Each of the steps described above with reference to FIGS. 6A-6K may be performed at a low temperature that does not cause damage to devices formed in underlying layers of the structure. In repeating the steps one or more times to form the multiple tiers, various changes may be made to cause the tiers to have different characteristics. For example, the tiers may include different semiconductor materials for forming the junctionless transistors. In another example, the tiers may include semiconductor materials with different crystal orientations and/or different levels of strain.

Figure 7A:
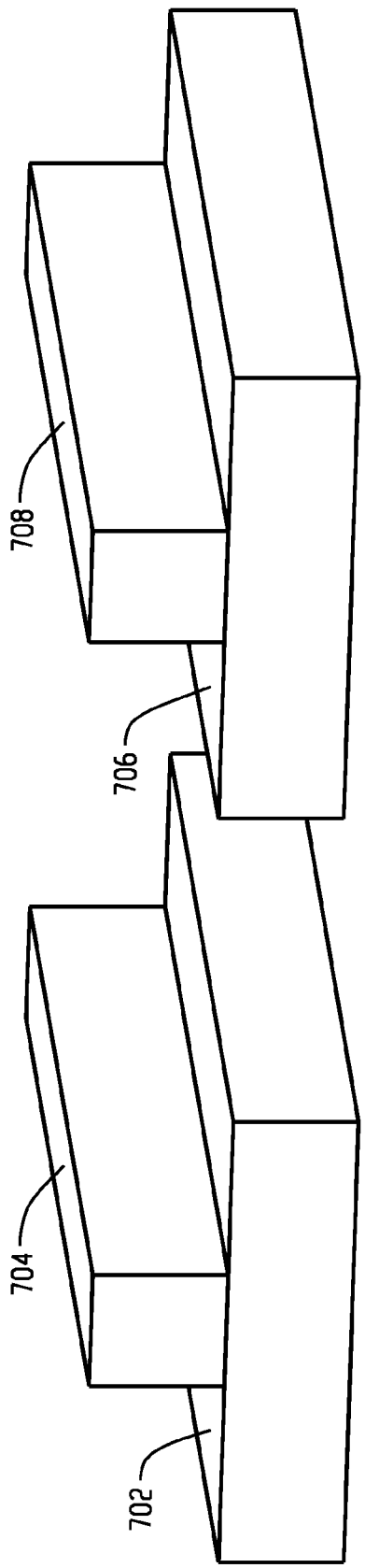
FIG. 7A depicts an N-type conductivity nanowire and a P-type conductivity nanowire formed substantially over dielectric materials, in accordance with some embodiments.

FIG. 7A depicts an N-type conductivity nanowire 704 and a P-type conductivity nanowire 708 formed substantially over dielectric materials 702, 706, respectively, in accordance with some embodiments. As described above with reference to FIG. 6I, after doping the amorphous portion of the seed layer 606 and performing SPE to recrystallize the amorphous portion of the seed layer 606, nanowires (i.e., nano-ribbons) may be formed in the recrystallized portions of the seed layer 606. For example, if the seed layer 606 includes both N- and P-type conductivity regions (i.e., as depicted in FIGS. 6A-6K), then at least one nanowire may be formed in each of the N- and P-type regions. The at least one nanowire formed in each of the N- and P-type regions may be depicted in FIG. 7A.

In FIG. 7A, regions 702, 706 may comprise a dielectric material (e.g., silicon dioxide) and may correspond to the dielectric layer 604 of FIGS. 6A-6K. N- and P-type conductivity regions formed substantially above the dielectric materials 702, 706 may be patterned to form the nanowires 704, 708. Specifically, the nanowire 704 may be formed in a single crystal N-type conductivity region (e.g., single crystal N-type conductivity region 622 of FIG. 6H), and the nanowire 708 may be formed in a single crystal P-type conductivity region (e.g., single crystal P-type conductivity region 624 of FIG. 6H). In another example, the recrystallized regions may comprise only a single N-type conductivity region or a single P-type conductivity region, and at least one nanowire may be formed in the single N-type conductivity region or the single P-type conductivity region.

Figure 7B:
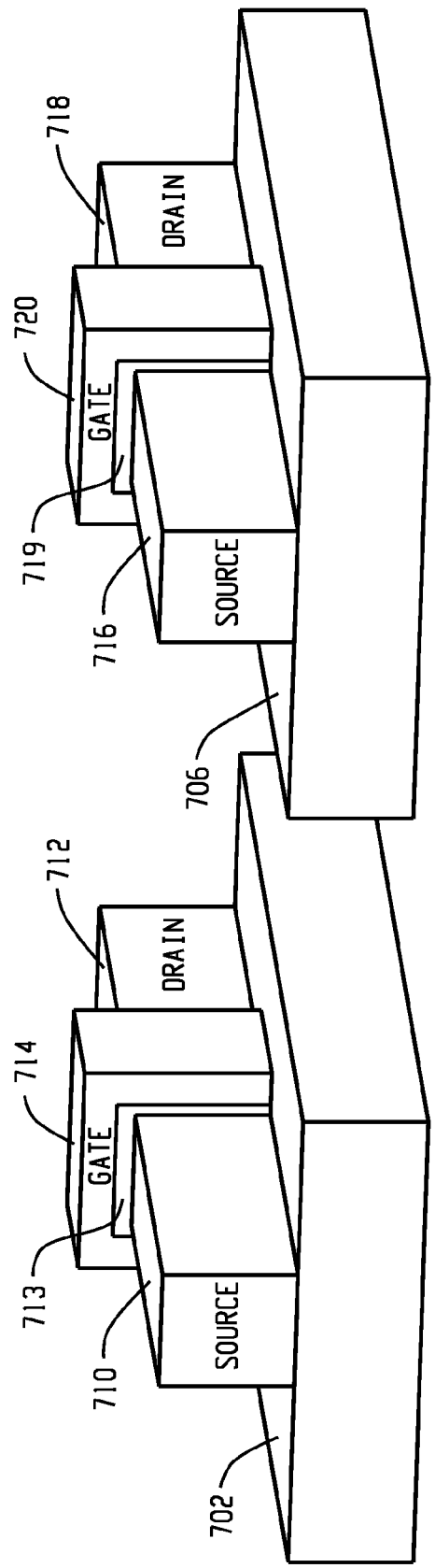
FIG. 7B depicts field effect transistors (FETs) formed using the N-type conductivity nanowire and the P-type conductivity nanowire, in accordance with some embodiments.

FIG. 7B depicts junctionless field effect transistors (FETs) formed using the N-type conductivity nanowire 704 and the P-type conductivity nanowire 708, in accordance with some embodiments. To form the junctionless FETs using the nanowires 704, 708, a gate dielectric and a gate stack may be formed around a portion of each of the nanowires 704, 708. In forming the junctionless transistors, the nanowire 704 may include a source region 710, a drain region 712, and a channel region that connects the source and drain regions 710, 712. Similarly, the nanowire 708 may include a source region 716, a drain region 718, and a channel region that connects the source and drain regions 716, 718.

As illustrated in FIG. 7B, a gate dielectric 713 and a gate stack 714 may be formed around a portion of the nanowire 704 to form an N-channel junctionless transistor. The gate dielectric 713 and the gate stack 714 may together comprise a gate region that is configured to control a conductivity of the channel region connecting the source and drain regions 710, 712. The N-channel junctionless transistor may thus comprise the source region 710, the drain region 712, the channel region, and the gate region including the gate dielectric 713 and the gate stack 714. Similarly, in FIG. 7B, a gate dielectric 719 and a gate stack 720 may be formed around a portion of the nanowire 708 to form a P-channel junctionless transistor. The P-channel junctionless transistor may thus comprise the source region 716, the drain region 718, the channel region connecting the source and drain regions 716, 718, and the gate region including the gate dielectric 719 and the gate stack 720.

Figure 8:
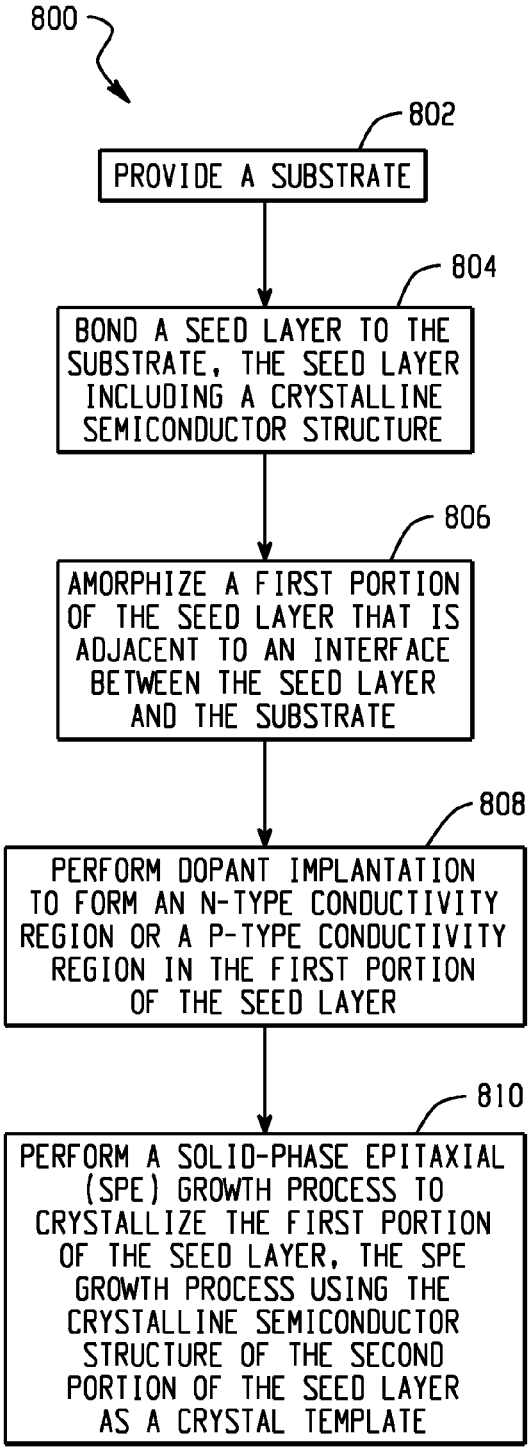
FIG. 8 is a flowchart illustrating an example method for forming a layer of semiconductor material, in accordance with some embodiments.

FIG. 8 is a flowchart 800 illustrating an example method for forming a layer of semiconductor material, in accordance with some embodiments. At 802, a substrate including one or more devices or features formed therein is provided. At 804, a seed layer is bonded to the substrate, where the seed layer includes a crystalline semiconductor structure. At 806, a first portion of the seed layer that is adjacent to an interface between the seed layer and the substrate is amorphized. A second portion of the seed layer that is not adjacent to the interface is not amorphized and maintains the crystalline semiconductor structure. At 808, dopant implantation is performed to form an N-type conductivity region or a P-type conductivity region in the first portion of the seed layer. At 810, after the dopant implantation, a solid-phase epitaxial (SPE) growth process is performed to crystallize the first portion of the seed layer. The SPE growth process uses the crystalline semiconductor structure of the second portion of the seed layer as a crystal template.

Figure 9:
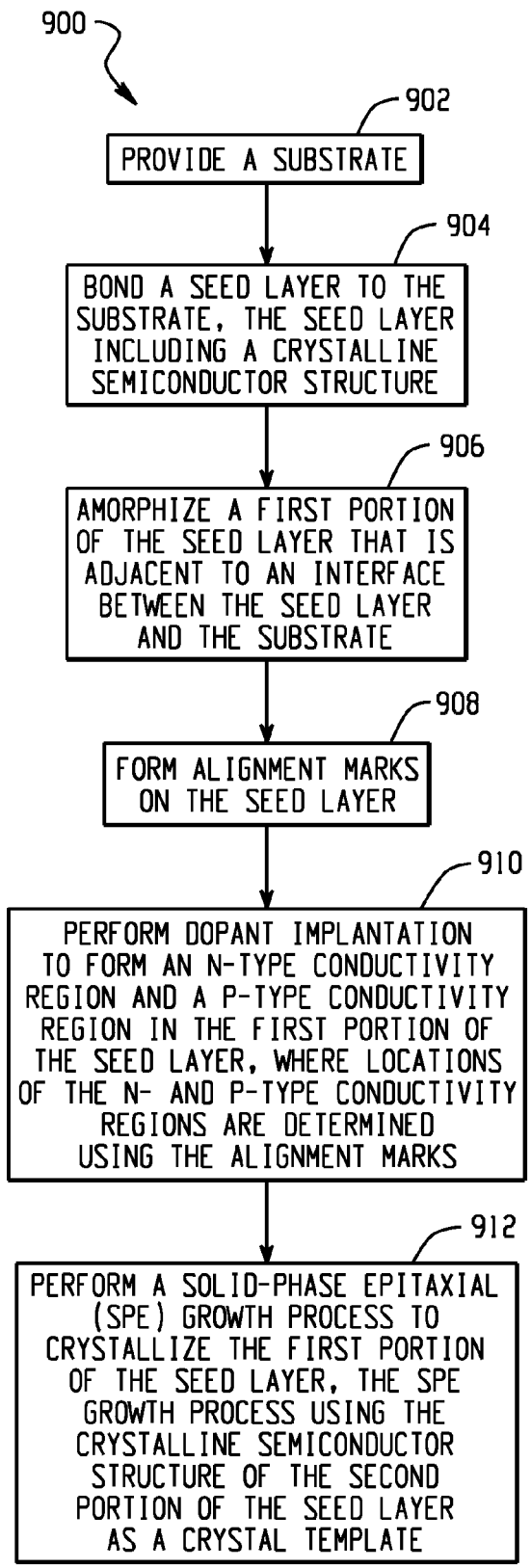
FIG. 9 is a flowchart illustrating another example method for forming a layer of semiconductor material, in accordance with some embodiments.

FIG. 9 is a flowchart 900 illustrating another example method for forming a layer of semiconductor material, in accordance with some embodiments. At 902, a substrate including one or more devices or features formed therein is provided. At 904, a seed layer is bonded to the substrate, where the seed layer includes a crystalline semiconductor structure. The seed layer has a thickness that causes the one or more devices or features to be visible through the seed layer. At 906, a first portion of the seed layer that is adjacent to an interface between the seed layer and the substrate is amorphized, where a second portion of the seed layer that is not adjacent to the interface is not amorphized and maintains the crystalline semiconductor structure. At 908, alignment marks are formed on the seed layer, where a location of the alignment marks is based on the one or more devices or features that are visible through the seed layer. At 910, dopant implantation is performed to form an N-type conductivity region and a P-type conductivity region in the first portion of the seed layer, where locations of the N- and P-type conductivity regions are determined using the alignment marks. At 912, after the dopant implantation, a solid-phase epitaxial (SPE) growth process is performed to crystallize the first portion of the seed layer. The SPE growth process uses the crystalline semiconductor structure of the second portion of the seed layer as a crystal template.

The present disclosure is directed to a method for fabricating a stack comprising a succession of layers of insulator and semiconductor materials, and the method can be used to fabricate 3D monolithic integrated circuits. As described above, low-temperature processing may be used during each step of the method, thus preventing devices formed in underlying levels from being damaged during the fabrication of upper device levels of the stack. The method may utilize a combination of a bonding process and an SPE growth process to form a single-crystal semiconductor layer including N-type conductivity regions and P-type conductivity regions substantially over a dielectric layer. The N- and P-type conductivity regions may be patterned to form junctionless transistors without the need for significant thermal processing steps. Low temperature transistor processing may be enabled by the use of the junctionless transistors.

The present disclosure is directed to a semiconductor-on-insulator structure and a method for forming a layer of semiconductor material. In an embodiment of a method for forming a layer of semiconductor material, a substrate including one or more devices or features formed therein is provided. A seed layer is bonded to the substrate, where the seed layer includes a crystalline semiconductor structure. A first portion of the seed layer that is adjacent to an interface between the seed layer and the substrate is amorphized. A second portion of the seed layer that is not adjacent to the interface is not amorphized and maintains the crystalline semiconductor structure. Dopant implantation is performed to form an N-type conductivity region or a P-type conductivity region in the first portion of the seed layer. After the dopant implantation, a solid-phase epitaxial (SPE) growth process is performed to crystallize the first portion of the seed layer. The SPE growth process uses the crystalline semiconductor structure of the second portion of the seed layer as a crystal template.

In another embodiment of a method for forming a layer of semiconductor material, a substrate including one or more devices or features formed therein is provided. A seed layer is bonded to the substrate, where the seed layer includes a crystalline semiconductor structure. The seed layer has a thickness that causes the one or more devices or features to be visible through the seed layer. A first portion of the seed layer that is adjacent to an interface between the seed layer and the substrate is amorphized, where a second portion of the seed layer that is not adjacent to the interface is not amorphized and maintains the crystalline semiconductor structure. Alignment marks are formed on the seed layer, where a location of the alignment marks is based on the one or more devices or features that are visible through the seed layer. Dopant implantation is performed to form an N-type conductivity region and a P-type conductivity region in the first portion of the seed layer, where locations of the N- and P-type conductivity regions are determined using the alignment marks. After the dopant implantation, a solid-phase epitaxial (SPE) growth process is performed to crystallize the first portion of the seed layer. The SPE growth process uses the crystalline semiconductor structure of the second portion of the seed layer as a crystal template.

In an embodiment of a semiconductor-on-insulator structure, the semiconductor-on-insulator structure includes a substrate comprising one or more devices or features formed therein. The substrate includes a semiconductor base layer and a dielectric layer formed over the semiconductor base layer. The semiconductor-on-insulator structure further includes a crystalline semiconductor layer formed over the substrate. Forming the crystalline semiconductor layer includes bonding a seed layer to the dielectric layer. The seed layer includes a crystalline semiconductor structure. Forming the crystalline semiconductor layer also includes amorphizing a first portion of the seed layer that is adjacent to an interface between the seed layer and the dielectric layer. A second portion of the seed layer that is not adjacent to the interface is not amorphized and maintains the crystalline semiconductor structure. Forming the crystalline semiconductor layer also includes performing dopant implantation to form an N-type conductivity region or a P-type conductivity region in the first portion of the seed layer. Forming the crystalline semiconductor layer further includes performing a solid-phase epitaxial (SPE) growth process to crystallize the first portion of the seed layer after the dopant implantation. The SPE growth process uses the crystalline semiconductor structure of the second portion of the seed layer as a crystal template, where the crystallized first portion of the seed layer comprises the crystalline semiconductor layer formed over the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a layer of semiconductor material, the method comprising:
    providing a substrate including one or more devices or features formed therein;
    bonding a seed layer to the substrate, the seed layer including a crystalline semiconductor structure;
    amorphizing a portion of the seed layer that is adjacent to an interface between the seed layer and the substrate;
    performing dopant implantation to form an N-type conductivity region or a P-type conductivity region in the seed layer; and
    after the dopant implantation, performing a solid-phase epitaxial (SPE) growth process to crystallize the seed layer by using the crystalline semiconductor structure.

2. The method of claim 1, wherein amorphizing the portion of the seed layer that is adjacent to an interface between the seed layer and the substrate further comprises amorphizing a first portion of the seed layer that is adjacent to the interface between the seed layer and the substrate, wherein a second portion of the seed layer that is not adjacent to the interface is not amorphized and maintains the crystalline semiconductor structure.

3. The method of claim 2, wherein performing the SPE growth process to crystallize the seed layer further comprises performing the SPE growth process by using the crystalline semiconductor structure of the seed layer as a crystal template.

4. The method of claim 3, wherein the performing of the dopant implantation forms both the N-type conductivity region and the P-type conductivity region in the first portion of the seed layer.

5. The method of claim 4, wherein the seed layer has a thickness that causes the one or more devices or features to be visible through the seed layer, wherein locations of the N- and P-type conductivity regions are determined based on the one or more devices or features that are visible through the seed layer, and wherein the locations of the N- and P-type conductivity regions are determined without forming alignment marks on the seed layer.

6. The method of claim 3, wherein the seed layer has a thickness that causes the one or more devices or features to be visible through the seed layer, the method further comprising:
forming alignment marks on the seed layer, a location of the alignment marks being based on the one or more devices or features that are visible through the seed layer, wherein the performing of the dopant implantation forms both the N-type conductivity region and the P-type conductivity region in the first portion of the seed layer, and wherein locations of the N- and P-type conductivity regions are determined using the alignment marks.

7. The method of claim 3, wherein the seed layer has a thickness that causes the one or more devices or features to be visible through the seed layer, and wherein the bonding of the seed layer to the substrate forms a structure, the method further comprising:
removing the second portion of the seed layer from the structure after the performing of the SPE growth process, the second portion of the seed layer being removed using an etching procedure or a chemical mechanical polishing (CMP) procedure;
forming alignment marks in the first portion of the seed layer after the removing of the second portion of the seed layer, a location of the alignment marks being based on the one or more devices or features that are visible through the first portion of the seed layer; and
patterning the first portion of the seed layer based on the alignment marks.

8. The method of claim 7, further comprising:
forming a dielectric layer over the patterned first portion of the seed layer;
bonding a second seed layer to the dielectric layer, the second seed layer including a second crystalline semiconductor structure, and the second seed layer having a second thickness that causes the patterns of the first portion of the seed layer to be visible through the second seed layer;
amorphizing a first portion of the second seed layer that is adjacent to an interface between the second seed layer and the dielectric layer, wherein a second portion of the second seed layer that is not adjacent to the interface between the second seed layer and the dielectric layer is not amorphized and maintains the second crystalline semiconductor structure;
performing a second dopant implantation to form an N-type conductivity region or a P-type conductivity region in the first portion of the second seed layer; and
after the second dopant implantation, performing a second SPE growth process to crystallize the first portion of the second seed layer, the second SPE growth process using the crystalline semiconductor structure of the second portion of the second seed layer as a second crystal template.

9. The method of claim 8, further comprising:
repeating the steps of forming a dielectric layer, bonding a second seed layer, amorphizing a first portion of the second seed layer, performing a second dopant implantation, and performing a second SPE growth process one or more times.

10. The method of claim 7, wherein the first portion of the seed layer is patterned to form a nanowire in the N-type conductivity region or the P-type conductivity region, the nanowire comprising source and drain regions and a channel region that connects the source and drain regions, the method further comprising:
forming a gate region around the nanowire, the gate region being configured to control a conductivity of the channel region, wherein the forming of the gate region forms a field effect transistor (FET) comprising the source region, the drain region, the channel region, and the gate region; and
forming one or more electrical connections between the one or more devices or features of the substrate and the FET.

11. The method of claim 7, wherein the performing of the dopant implantation forms both the N-type conductivity region and the P-type conductivity region in the first portion of the seed layer, wherein the first portion of the seed layer is patterned to form i) at least one nanowire in the N-type conductivity region, and ii) at least one nanowire in the P-type conductivity region, each of the nanowires comprising source and drain regions and a channel region that connects the source and drain regions, the method further comprising:
forming a gate region around each of the nanowires, each of the gate regions being configured to control a conductivity of an associated channel region, wherein the forming of the gate region forms a field effect transistor (FET) comprising the source region, the drain region, the channel region, and the gate region of a corresponding nanowire.

12. The method of claim 3, wherein the second portion of the seed layer is adjacent to the first portion of the seed layer, and wherein the first and second portions of the seed layer occupy an entirety of a thickness of the seed layer.

13. The method of claim 3, wherein the SPE growth process is performed from about 400 to about 600 degrees Celsius.

14. The method of claim 3, wherein the bonding of the seed layer, the amorphizing of the first portion, the performing of the dopant implantation, and the performing of the SPE growth process steps are performed at one or more temperatures, each of the one or more temperatures being a temperature that does not cause damage to the one or more devices or features formed in the substrate.

15. The method of claim 3, wherein the first portion of the seed layer is crystallized using the second portion of the seed layer that is disposed above the first portion of the seed layer, wherein the crystallization begins at an interface between the first portion and the second portion, and wherein the SPE growth process includes annealing a structure comprising the substrate and the first and second portions of the seed layer.

16. The method of claim 1, wherein the substrate includes:
a semiconductor base layer; and
a dielectric layer formed over the semiconductor base layer, wherein the seed layer is bonded to the dielectric layer.

17. The method of claim 1, wherein the bonding of the seed layer to the substrate includes:
bonding a semiconductor-on-insulator wafer to the substrate to form a structure, the semiconductor-on-insulator wafer including the seed layer, a dielectric layer, and a semiconductor base layer, wherein the bonding of the semiconductor-on-insulator wafer to the substrate forms the interface between the seed layer and the substrate; and
after the bonding of the semiconductor-on-insulator wafer to the substrate, removing the dielectric layer and the semiconductor base layer from the structure, wherein the removing of the dielectric layer and the semiconductor base layer from the structure does not remove an entirety of the seed layer from the substrate.

18. A method for forming a layer of semiconductor material, the method comprising:
   providing a substrate including one or more devices or features formed therein;
   bonding a seed layer to the substrate, the seed layer including a crystalline semiconductor structure, and the seed layer having a thickness that causes the one or more devices or features to be visible through the seed layer;
   amorphizing a portion of the seed layer that is adjacent to an interface between the seed layer and the substrate;
   forming alignment marks on the seed layer, a location of the alignment marks being based on the one or more devices or features that are visible through the seed layer;
   performing dopant implantation to form an N-type conductivity region and a P-type conductivity region in the seed layer, wherein locations of the N- and P-type conductivity regions are determined using the alignment marks; and
   after the dopant implantation, performing a solid-phase epitaxial (SPE) growth process to crystallize the seed layer.

19. A semiconductor-on-insulator structure comprising:
   a substrate including one or more devices or features formed therein, wherein the substrate further includes:
      a semiconductor base layer, and
      a dielectric layer formed over the semiconductor base layer; and
   a crystalline semiconductor layer formed over the substrate, wherein forming the crystalline semiconductor layer includes:
      bonding a seed layer to the dielectric layer, the seed layer including a crystalline semiconductor structure,
      amorphizing a portion of the seed layer that is adjacent to an interface between the seed layer and the dielectric layer,
      performing dopant implantation to form an N-type conductivity region or a P-type conductivity region in the seed layer, and
      after the dopant implantation, performing a solid-phase epitaxial (SPE) growth process to crystallize the seed layer.

20. The semiconductor-on-insulator structure of claim 19, wherein the bonding of the seed layer, the amorphizing of the portion of the seed layer, the performing of the dopant implantation, and the performing of the SPE growth process steps are performed at one or more temperatures, each of the one or more temperatures being a temperature that does not cause damage to the one or more devices or features formed in the substrate.

* * * * *